(12) United States Patent
Ishinabe et al.

(10) Patent No.: US 7,155,914 B2
(45) Date of Patent: Jan. 2, 2007

(54) COOLING STRUCTURE FOR ELECTRONIC EQUIPMENT

(75) Inventors: Minoru Ishinabe, Kawasaki (JP); Hiroki Uchida, Kawasaki (JP); Hideshi Tokuhira, Kawasaki (JP); Hiroaki Date, Kawasaki (JP); Wataru Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/222,793

(22) Filed: Sep. 12, 2005

(65) Prior Publication Data

US 2006/0005549 A1  Jan. 12, 2006

Related U.S. Application Data

(63) Continuation of application No. PCT/JP03/02960, filed on Mar. 12, 2003.

(51) Int. Cl.
  *F25D 23/12* (2006.01)
(52) U.S. Cl. .......................................... 62/3.2; 62/259.2
(58) Field of Classification Search ................... 62/3.2, 62/3.3, 3.6, 259.2; 165/80.4; 361/699, 700
See application file for complete search history.

(56) References Cited

U.S. PATENT DOCUMENTS

| | | | |
|---|---|---|---|
| 6,069,791 A * | 5/2000 | Goto et al. ................. | 361/687 |
| 6,496,367 B1 | 12/2002 | Donahoe et al. | |
| 6,791,834 B1 | 9/2004 | Nakagawa et al. | |

FOREIGN PATENT DOCUMENTS

| JP | 3-74864 | 3/1991 |
|---|---|---|
| JP | 8-213783 | 8/1996 |
| JP | 9-305267 | 11/1997 |
| JP | 10-213370 | 8/1998 |
| JP | 11-87961 | 3/1999 |
| JP | 2942468 | 6/1999 |
| JP | 11-177264 | 7/1999 |
| JP | 11-202978 | 7/1999 |
| JP | 2000-165077 | 6/2000 |
| JP | 2000-304293 | 11/2000 |
| JP | 2002-163041 | 6/2002 |
| JP | 2002182797 | 6/2002 |

* cited by examiner

*Primary Examiner*—Melvin Jones
(74) *Attorney, Agent, or Firm*—Staas & Halsey LLP

(57) ABSTRACT

A cooling structure for electronic equipment is designed for cooling a heat-generating body (2a) disposed inside a case (20) by recovering heat generated by the heat-generating body (2a) and dissipating the heat to the outside of the case (20). The cooling structure includes a heat-receiving section (4) for recovering heat generated in the heat-generating body (2a), a thermally insulated space (6) provided with an air inflow orifice (42a) and an air outflow orifice (42b) and thermally insulated from the heat-generating body (2a) and heat-receiving section (4) by a thermally insulating member (40), a heat-dissipating section (7) provided inside the thermally insulated space (6), a heat transfer member (5) for transferring the heat recovered in the heat-receiving section (4) to the heat-dissipating section (7), and a fan (22) for generating forcibly an air flow in the thermally insulated space (6). The heat generated by the heat-generating body (2a) is transferred to the heat-dissipating section (7) via the heat-receiving section (4) and heat transfer member (5) and dissipated in a concentrated fashion by using the fan (22) inside the thermally insulated space (6).

10 Claims, 26 Drawing Sheets

COOLING STRUCTURE FOR ELECTRONIC EQUIPMENT

This application is a continuing application, filed under 35 U.S.C. §111(a), of International Application PCT/JP2003/002960, filed Mar. 12, 2003, incorporated by reference herein.

TECHNICAL FIELD

The present invention relates to a cooling structure for electronic equipment, and more particularly to a cooling structure for space-saving electronic equipment such as notebook personal computers.

BACKGROUND ART

In recent years a remarkable progress has been attained in performance improvement of electronic equipment. In particular, functional capabilities and speed of CPU or chip sets (referred to hereinbelow as "heat-generating body") which are heat generation sources located inside the electronic equipment have been continuously increasing. On the other hand, miniaturization and thickness reduction of electronic equipment, in particular, space-saving electronic equipment such as notebook personal computers (referred to hereinbelow as "notebook PC") are also strongly required. With this in view, rapid increase in heat generation per unit volume in electronic equipment can be anticipated. As a result, there is a risk of temperature increasing in the electronic equipment and, for example, the CPU exploding or fracturing under the effect of heat. For this reason, it is necessary to cool the heat-generating bodies with efficiency higher than that of the conventional cooling methods in order to prevent the temperature of electronic equipment from rising.

There is a technology for cooling a heat-generating body whereby the heat recovered from the heat-generating body is dissipated from a heat-dissipating section provided on the display section side by transporting a cooling liquid as a heat transfer medium to the display section side of the case. This technology is disclosed in Japanese Patent Application Laid-open No. 2002-182797.

With the technology disclosed in Japanese Patent Application Laid-open No. 2002-182797, the heat is recovered by the cooling liquid from the heat-generating body by connecting a tube filled with the cooling liquid to the heat-generating body via a heat-receiving head, and the recovered heat is dissipated by passing the tube between the display section case and the liquid-crystal display panel of the display section. As a result, dissipation of heat locally generated inside the case can be conducted from a wider range by using the display section case.

However, with such a technology, because spontaneous cooling (spontaneous heat dissipation) is used for heat dissipation, only a limited cooling efficiency can be attained. Furthermore, because the size of the case has to be increased to increase the heat dissipation quantity, the requirements relating to miniaturization and thickness reduction of equipment cannot be fully met. Moreover, because heat dissipation from the case is used, the increase in the temperature of the case cannot be avoided and the user feels uncomfortable when touching the case.

Japanese Patent Application Laid-open No. 11-177264 discloses a cooling technology similar to that described in Japanese Patent Application Laid-open No. 2002-182797 and has similar drawbacks.

Japanese Patent Application Laid-open No. 2002-163041 discloses a technology whereby diffusion of heat in the heat-dissipating section provided on the display section side is forcibly conducted with a fan as a technology for increasing the cooling effect, while inhibiting the increase in size.

However, though the cooling technology of Japanese Patent Application Laid-open No. 2002-163041 provides for forced cooling with a fan, no special thermal insulation treatment is carried out with respect to the display section case. Therefore, heat is unavoidably transferred to the display section case in an amount equivalent to that during heat dissipation. Therefore, the temperature of the display section case rises and the user feels uncomfortable when touching the case.

The technology using forcible cooling with a fan is also described in Japanese Patent Applications Laid-open No. 11-87961 and 10-213370. The cooling technology described in those open publications does not involve thermal insulation treatment of the case in the heat-dissipating section, and if the quantity of heat that has to be dissipated increases, the temperature of the case rises and the user always feels uncomfortable when touching the case.

DISCLOSURE OF THE INVENTION

Accordingly, it is an object of the present invention to provide a cooling structure for electronic equipment that is capable of efficiently cooling the heat-generating body and inhibiting the adverse effect produced on the case by the increase in temperature of the heat-dissipating section employed for dissipating the heat recovered from the heat-generating body.

The cooling structure for electronic equipment in accordance with the first aspect of the present invention comprises a cooling structure for electronic equipment for cooling at least one heat-generating body disposed inside a case by recovering heat generated by the heat-generating body and dissipating the heat to the outside of the case. The cooling structure comprises a heat-receiving section for recovering heat generated at the heat-generating body, a thermally insulated space provided with an air inflow orifice and an air outflow orifice and thermally insulated from the heat-generating body and the heat-receiving section by a thermally insulating member, a heat-dissipating section provided inside the thermally insulated space, heat transfer means for transferring the heat recovered by the heat-receiving section to the heat-dissipating section, and a fan for generating forcibly an air flow inside the thermally insulated space. The heat generated by the heat-generating body is transferred to the heat-dissipating section via the heat-receiving section and the heat transfer means and dissipated in a concentrated fashion by using the fan inside the thermally insulated space.

With such a configuration, because the heat-dissipating section is provided inside the thermally insulated space, even when the quantity of heat generated by the heat-generating body is increased and the heat-dissipating section is heated to a higher temperature, the risk of heating the electronic components located in the vicinity of the heat-dissipating section or the case itself is eliminated. Therefore, even if the quantity of heat generated by the heat-generating body increases, it is possible to avoid the risk of thermally damaging the electronic components located in the vicinity of the heat-dissipating section. At the same time, the outer wall temperature of the case is comparatively easily held within the ergonomically preferred temperature range (for example, below 40° C.).

The present invention is based on a concept completely different from that of the conventional general cooling structure. Thus, in the prior art, the surface area that can be used for heat dissipation was usually increased as much as possible to enhance cooling. Therefore, as described in Japanese Patent Application Laid-open No. 11-87961, even when the space partitioned from the heat-generating body was forcibly cooled with a fan, it was necessary to take measures to suppress heat transfer between the partitioned space and the case. By contrast, in accordance with the present invention, cooling is conducted in a thermally insulated space. Such an approach is based on the idea that even if the temperature inside a thermally insulated space rises, heat is not transferred to the adjacent case or components and, therefore, this temperature rise makes no difference, provided it is in the thermally insulated space. This idea is completely different from that of the conventional technology.

In the preferred embodiment of the present invention, the thermally insulated space is provided inside a separate case connected to the outside of the case via the heat transfer means.

In another preferred embodiment of the present invention, the thermally insulated space is provided in a tilt mechanism having a function of tilting the case. The tilt mechanism is defined as being also suitable for cooling.

In yet another preferred embodiment of the present invention, the thermally insulated space is provided in a protective cover having a function of protecting a connector and/or a slot. In this case, the protective cover is defined as being also suitable for cooling.

It is preferred that a heat-absorbing surface of a Peltier element be connected to the heat-dissipating section, and a heat-generating surface of the Peltier element be exposed to the thermally insulated space. With such a configuration, cooling of the heat-dissipating section connected to the heat-absorbing surface is efficiently conducted with a heat pump function of the Peltier element and cooling of the heat-generating body can be conducted more efficiently. Furthermore, because the temperature of the heat-generating surface becomes higher than that of the heat-dissipating section, the difference in temperature between the heat-generating surface and the air becomes larger than the difference in temperature between the heat-dissipating section and the air and the heat transfer rate of the air further increases. In other words, the Peltier element demonstrates the effect of enhancing the forcible cooling of the heat-dissipating body with the fan and further enhancing the cooling function.

The cooling structure preferably further comprises monitoring means for monitoring the temperature of the heat-generating body, judgment means for judging as to whether or not the temperature of the heat-generating body monitored by the monitoring means has reached a prescribed temperature, and control means for controlling the drive power of the Peltier element, a pump contained in the heat transfer means, and the fan according to the judgment results obtained with the judgment means. With such a configuration, the drive of the Peltier element can be conducted as necessary only in the case where the amount of heat generated by the heat-generating body increases and the forcible cooling of the heat-dissipating section with the fan alone becomes insufficient. For this reason, power consumption can be reduced and the amount of heat generated in the Peltier element when the Peltier element is driven can be also reduced.

In the preferred embodiment of the present invention, the heat transfer member is selected from the group including a metal material comprising copper and/or aluminum, a heat pipe, and a coolant channel having a coolant circulating inside thereof.

Further, the thermally insulating member preferably has a two-layer structure comprising an inner layer comprising an IR-reflecting material and an outer layer comprising a thermally insulating material. With such a configuration, the reliability of thermal insulation operation is high.

In the preferred embodiment of the present invention, the heat-generating body is provided in a plurality, and the heat transfer means comprises a plurality of parallel heat transfer channels connected to the plurality of heat-generating bodies.

In another preferred embodiment of the present invention, the heat-generating body is provided in a plurality, and the heat transfer means comprises at least one heat transfer channel in which the heat-generating bodies are arranged in series so that a heat-generating body with a relatively small quantity of heat generation is positioned upstream in the heat transfer direction and a heat-generating body with a relatively large quantity of heat generation is positioned downstream in the heat transfer direction.

BEST MODE FOR CARRYING OUT THE INVENTION

The cooling structure for electronic equipment of the embodiment of the present invention will be described below with reference to the appended drawings. In the description of the embodiments below, the explanation will be conducted by considering a space-saving personal computer (referred to hereinbelow as "space-saving PC") such as the so-called notebook PC as an example of electronic equipment to which the present invention is applied.

The cooling structure for a notebook PC of the first embodiment of the present invention will be described in detail hereinbelow with reference to FIGS. 1 to 5.

Figure 1:
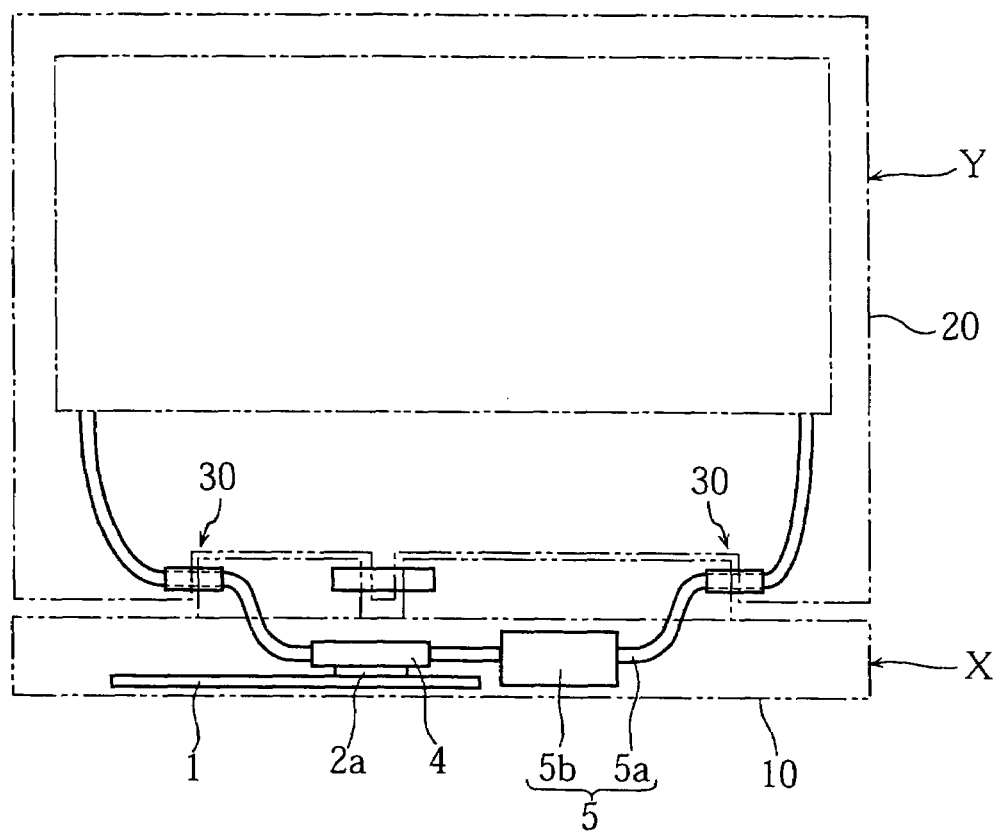
FIG. 1 is a schematic front view illustrating the cooling structure for electronic equipment of the first embodiment of the present invention.
Figure 2:
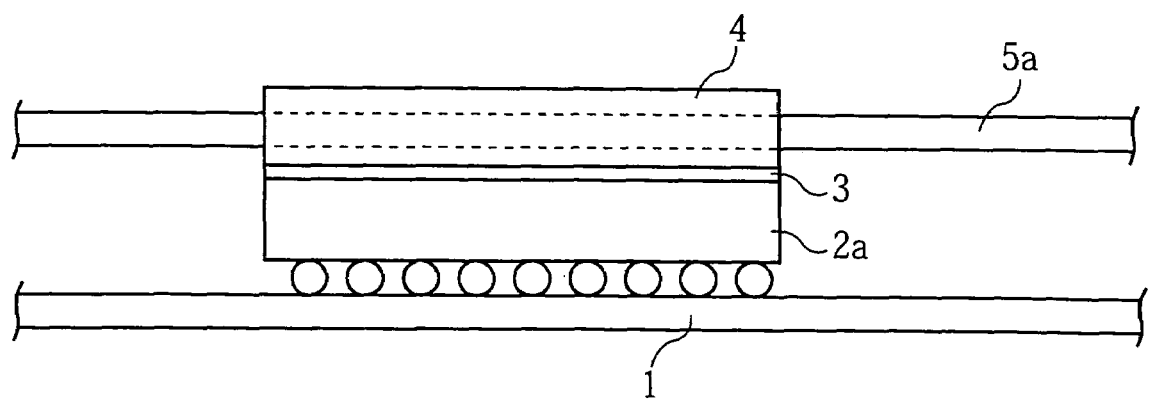
FIG. 2 is an enlarged view of the main portion of the cooling structure.

FIG. 1 is a schematic front view of a notebook PC composed of a main body section X and a display section Y rotatably linked to the main body section X. In FIG. 1, the outer contour of a case 10 of the main body section X and the outer contour of a case 20 of the display section Y are shown by two-dot-dash lines. FIG. 2 is an enlarged view of the main portion of the structure shown in FIG. 1.

A circuit substrate 1 supported inside the case 10 is disposed in the main body section X. Electric and electronic elements, integrated circuits, and electronic circuit groups necessary for operating the notebook PC are mounted on the circuit substrate 1. Furthermore, a CPU, a MPU, and a chip set that become heat-generating sources during operation of the notebook PC are also disposed thereon. The main body section X also accommodates other heat-generating sources such as a battery unit serving as a power source and a hard disk drive serving as a memory unit. In the present embodiment hereinbelow, the CPU, MPU, and chip set that become heat-generating sources during operation of the notebook PC and also the hard disk drive and battery unit will be referred to as heat-generating bodies 2a, 2b . . . in the order of decreasing heat generation quantity (see the below-described FIG. 8). However, FIG. 1 shows the structure for cooling only the heat-generating body 2a with the largest heat generation quantity.

A heat-receiving section 4 is thermally joined via a thermally conductive paste 3 to the heat-generating body 2a, as shown in FIG. 2. The thermally conductive paste 3 fills the space between the heat-generating body 2a and heat-receiving section 4 and is provided to transfer efficiently the heat generated by the heat-generating body 2a to the heat-receiving section 4. A thermal compound can be used as the thermally conductive paste 3. The heat-receiving section 4 is provided to inhibit the accumulation of heat in the heat-generating body 2a by efficiently transferring the heat recovered from the heat-generating body 2a to heat transfer means 5. A heat exchanger having a structure with a coolant circulating inside thereof or a heat transfer block from a metal with excellent thermal conductivity, such as aluminum or copper, can be used as the heat-receiving section 4. Further, a structure in which a tube is filled with a coolant and the coolant is circulated by using a coolant pump, a heat pipe, and a metal material composed of a metal with excellent thermal conductivity such as aluminum and copper can be used as the heat transfer means.

In the present embodiment, as shown in FIG. 1 and FIG. 2, the explanation will be conducted by using a heat exchanger as the heat-receiving section 4 and a structure in which a tube 5a is filled with a coolant and the coolant is circulated by using a coolant pump 5b as the heat transfer means 5.

Figure 3:
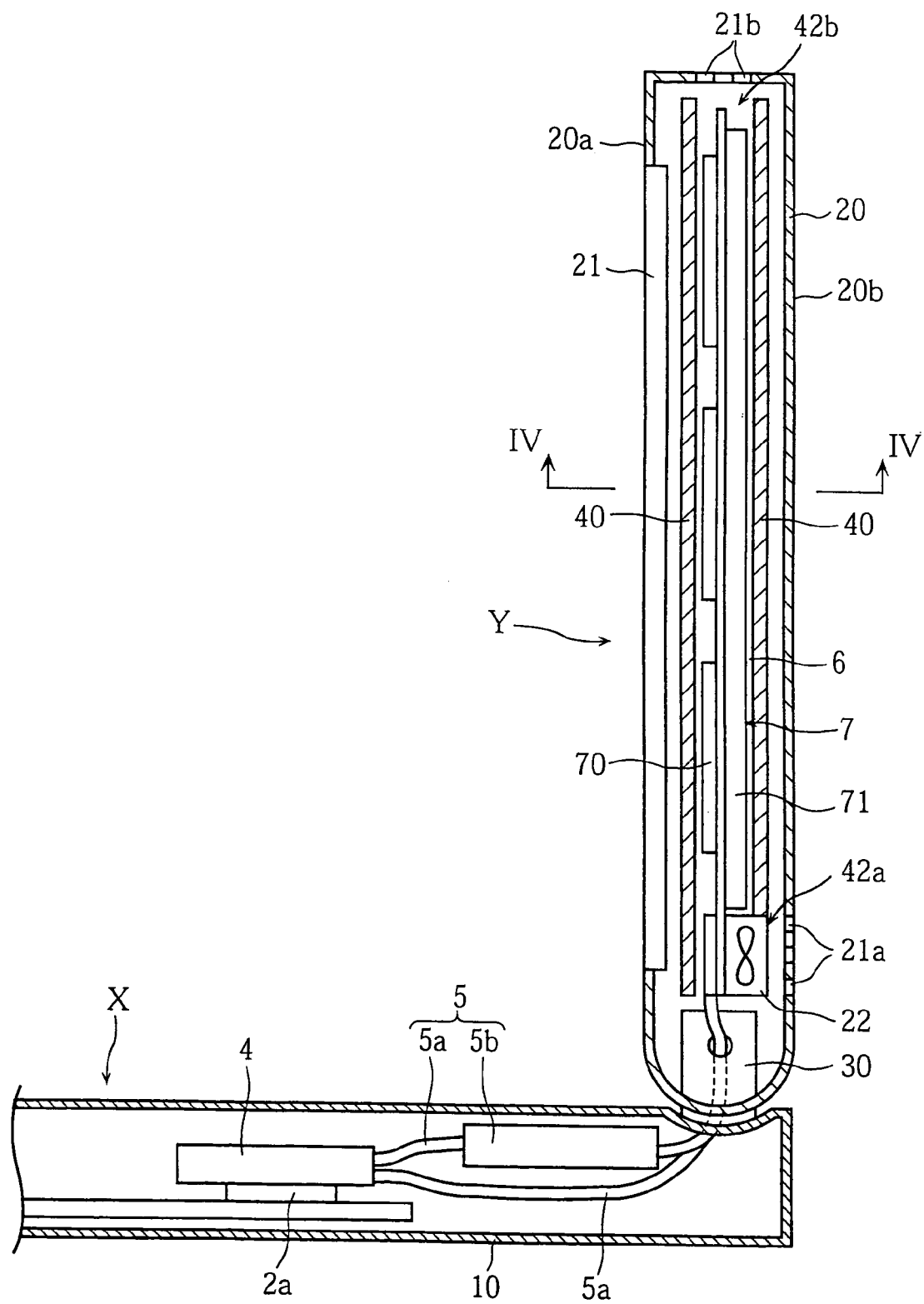
FIG. 3 is an enlarged schematic side view of the main portion of the cooling structure.
Figure 4:
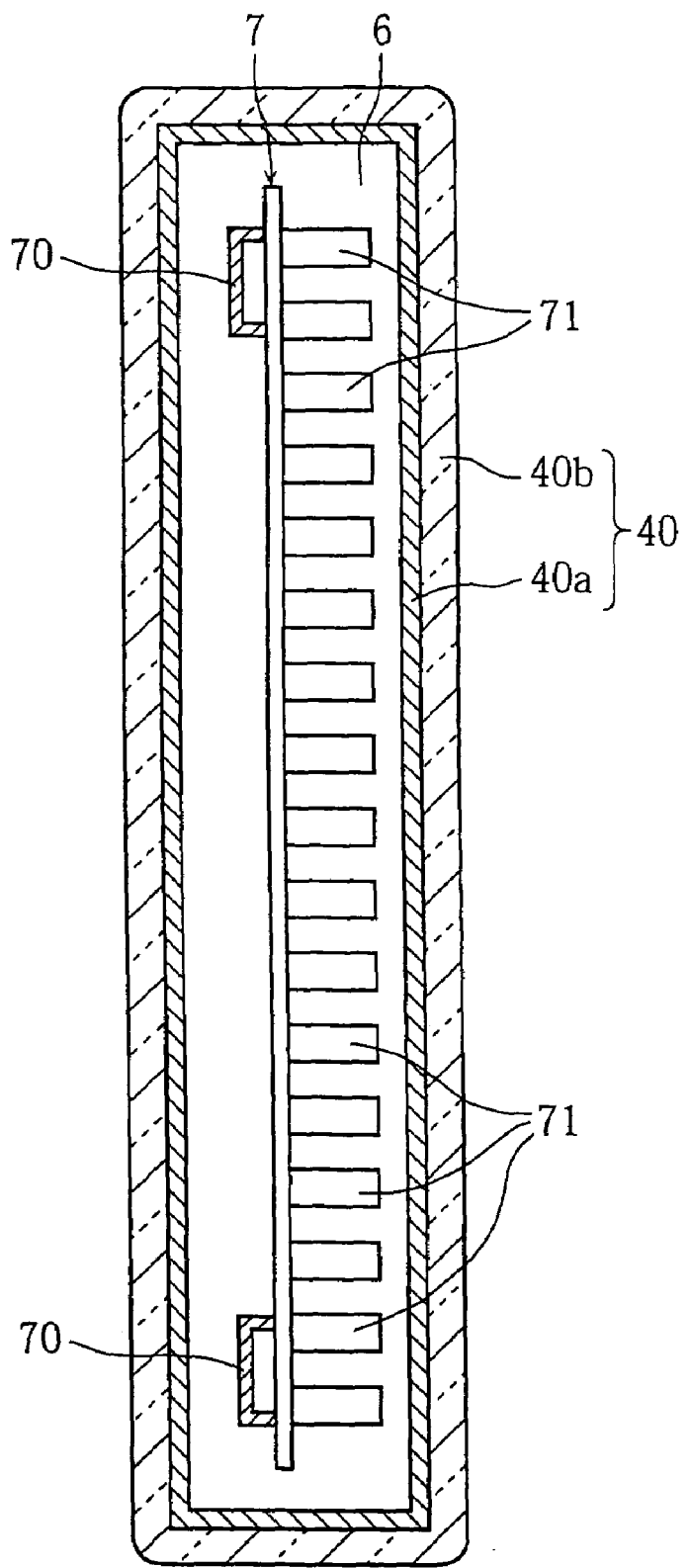
FIG. 4 is a cross-sectional view along the line IV—IV in FIG. 3.

FIG. 3 is a schematic side view showing an enlarged main portion of the notebook PC. Further, FIG. 4 is a cross-sectional view along the line IV—IV in FIG. 3. In FIG. 3, part of the structure is shown by a cross section to illustrate the internal structure of the main body section case 10 and display section case 20.

In the cooling structure for a notebook PC of the present embodiment, as shown in FIG. 3, the heat generated from the heat-generating body 2a is recovered by a coolant circulating inside the heat-exchanger 4 thermally joined to the heat-generating body 2a, the heat is carried to a heat-dissipating body 7 disposed in a thermally insulated space 6 provided inside the display section case 20 via the tube 5a, and the heat is emitted to the outside of the notebook PC from the heat-dissipating body 7.

The thermally insulated space 6 is regulated by a thermally insulating structural body 40 having channels for air inside thereof, as shown in FIG. 3. The thermally insulating structural body 40 is provided between a display unit 21 provided on the front surface wall 20a of the case 20 and the rear surface wall 20b of the case 20. As shown in FIG. 4 in greater detail, the thermally insulating structural body 40 has a double-wall structure composed of an inner wall section 40a formed from an IR-reflecting material and an outer wall section 40b formed from a material with low thermal conductivity so as to cover the inner wall section 40a. Examples of IR-reflecting materials include aluminum and stainless steel, and examples of materials with low thermal conductivity include glass wool, asbestos, foamed styrene, and foamed urethane. The structure of the thermally insulating structural body 40 is not limited to the above-described double-wall structure and may be composed of any one of the walls.

As shown in FIG. 3, the thermally insulating structural body 40 regulating the thermally insulated space 6 is open in the base end section (lower end section when the display section Y is raised) and the other end section (upper end section when the display section Y is raised). The free end sections function as an inlet opening 42a for inletting the cooling air into the thermally insulated space 6 via an air intake opening 21a provided in the case 20 and as an outlet opening 42b for releasing the air to the outside via an air release opening 21b provided in the case 20. Further, a fan 22 is installed in the inlet opening 42a of the thermally insulating structural body 40. A sirocco-type fan can be used as the fan 22.

A heat exchanger serving as a heat dissipating body 7 is disposed in the thermally insulated space 6 inside the thermally insulating structural body 40. The heat exchanger 7 comprises a coolant channel 70 and a plurality of fins 71. Materials with excellent thermal conductivity, for example, metals such as aluminum, magnesium, copper, titanium, and stainless steel and alloys containing those metals can be used as the materials constituting the heat exchanger 7.

Figure 5:
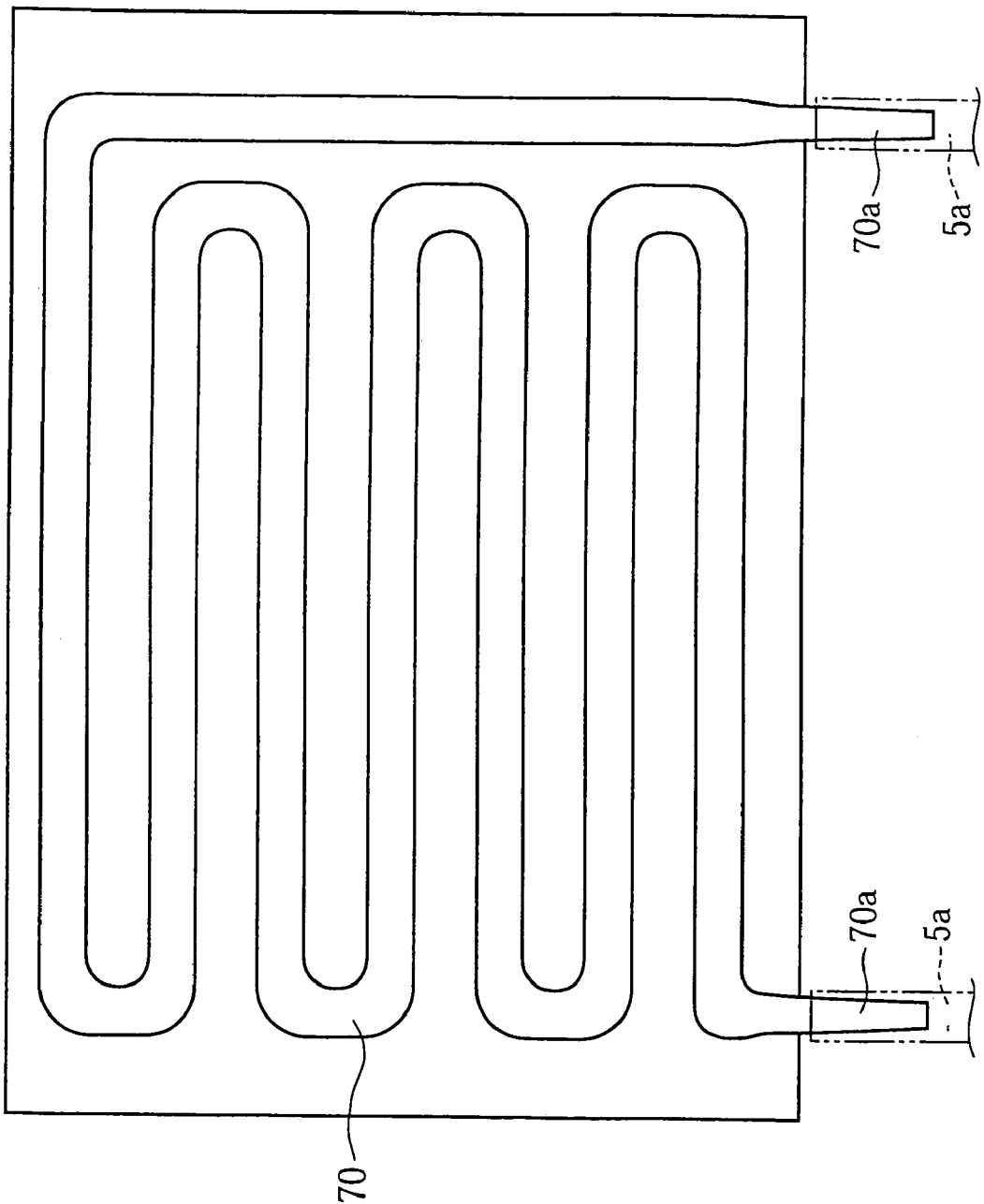
FIG. 5 is a schematic front view illustrating an example of a heat exchanger constituting part of the cooling structure.
Figure 6:
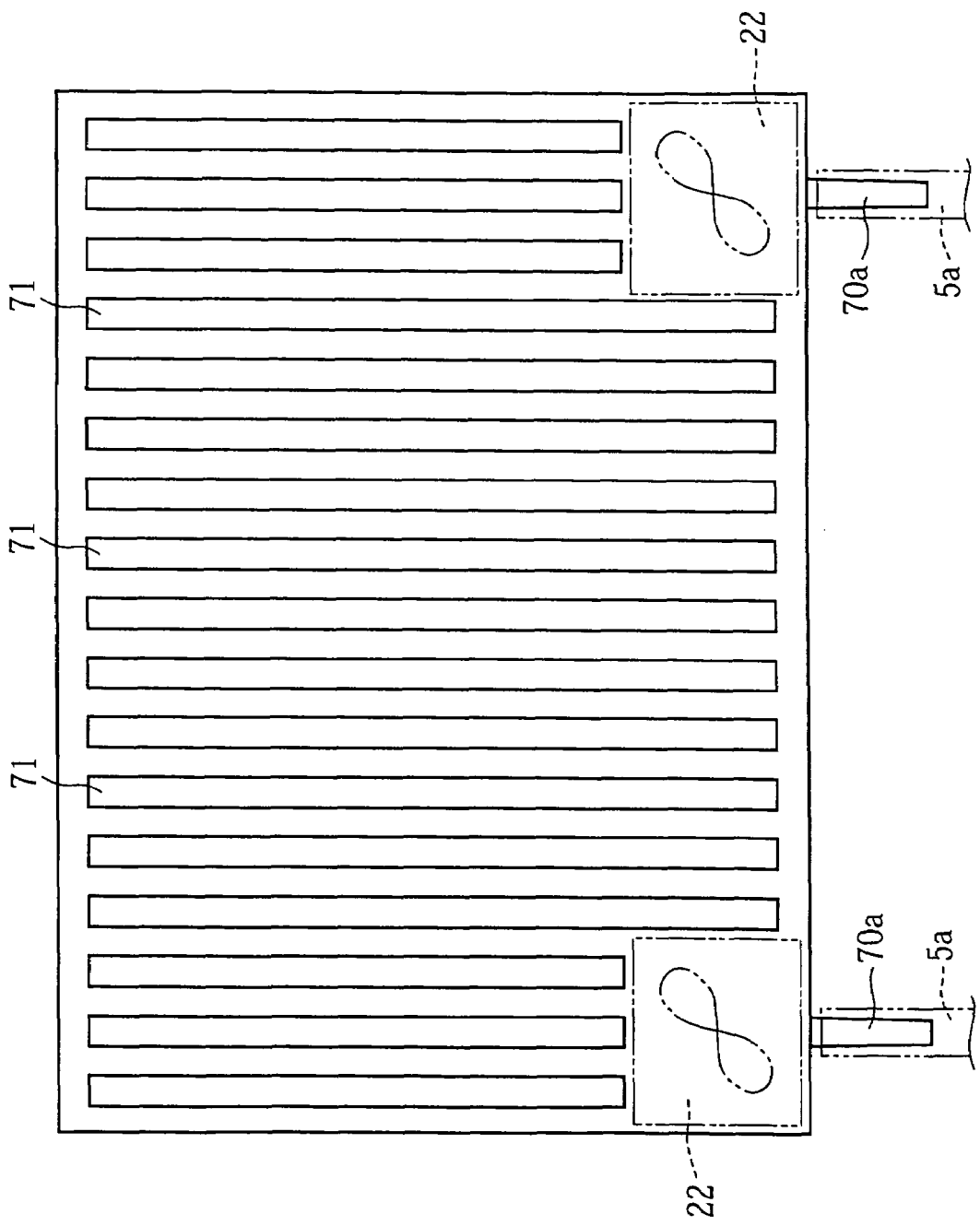
FIG. 6 is a schematic rear view illustrating an example of a heat exchanger constituting part of the cooling structure.
Figure 7:
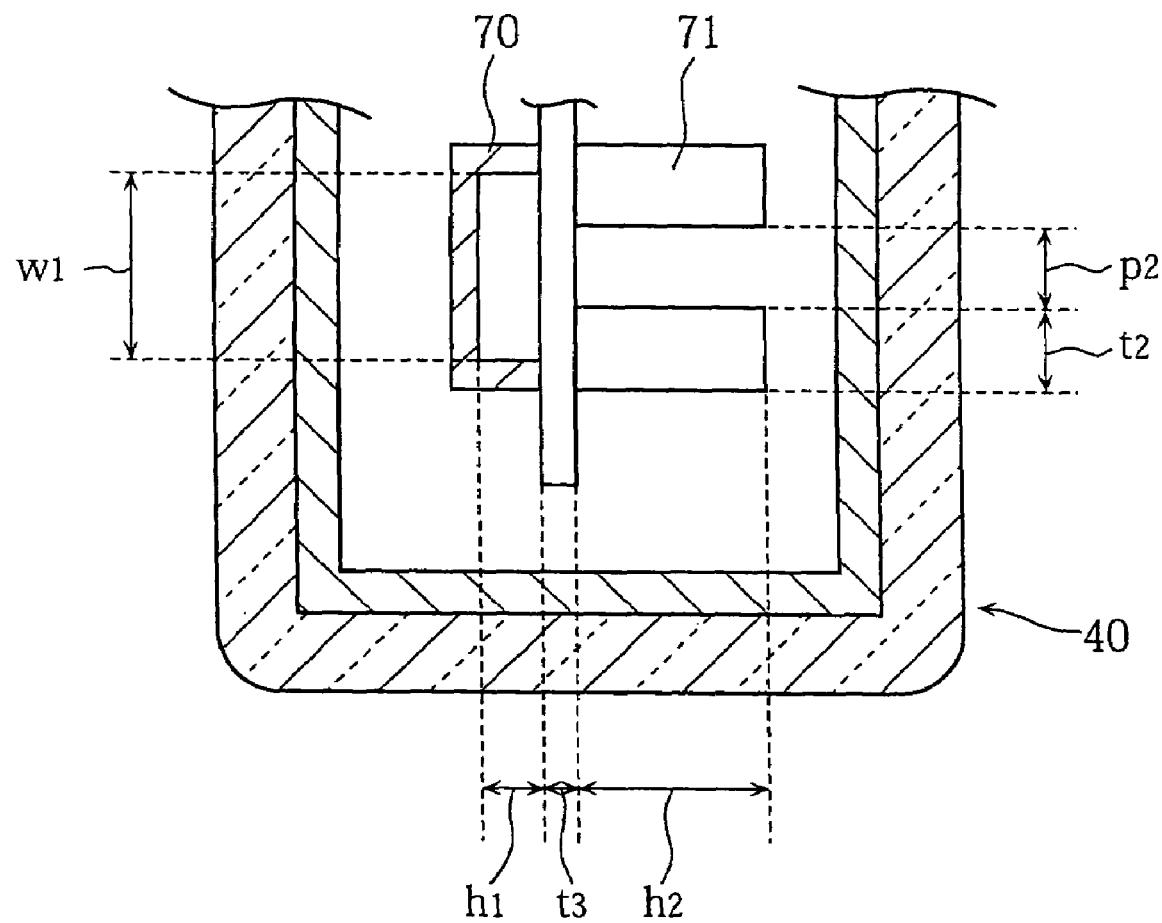
FIG. 7 is an enlarged view of the main portion in the cross-sectional view shown in FIG. 4.

FIG. 5 and FIG. 6 are schematic views illustrating an example of the heat exchanger 7. FIG. 5 is a front view thereof, and FIG. 6 is a rear view thereof. FIG. 7 is an enlarged view of the main portion of the cross-sectional view shown in FIG. 4.

As shown in FIG. 5, the coolant channel 70 has a zigzag configuration and is connected to a tube 5a in the connection sections 70a at both ends thereof. The structure of the coolant channel is such that the coolant flowing in from the tube 5a circulates inside the coolant channel 70 and the heat carried by the coolant can be efficiently transferred to the fins 71 (see FIG. 6). Further, as shown clearly in FIG. 7, the inner cross section of the coolant channel 70 has a rectangular shape. The height $h_1$ thereof is, for example, 2–5 mm, and the width $w_1$ is, for example, 7–13 mm. However, the structure of the coolant channel is not limited to that shown in FIG. 5 and FIG. 7.

As shown in FIG. 6, the fins 71 are provided with the object of increasing the heat dissipation surface area in order to dissipate effectively to the air the heat recovered from the coolant circulating in the coolant channel. The fins have a structure enabling forcible air cooling with the external air introduced into the thermally insulated space 6 (see FIG. 3) with the fan 22. Further, as shown clearly in FIG. 6 and FIG. 7, the fins 71 are in the form of an almost rectangular parallelepiped, the height $h_2$ thereof is 2–5 mm, the thickness $t_2$ is 0.5–1.5 mm, and the arrangement pitch $p_2$ is 5–15 mm. However, the structure of the fins 71 is not limited to that shown in FIG. 6.

Guiding of the tube 5a between the heat exchanger 4 and heat dissipating body 7 is conducted, for example, in the following manner. Thus, as shown in FIG. 1 and FIG. 3, the tube 5a connected to the heat exchanger 4 is pulled into the case 20 of the display section Y via a hinge section 30 for rotatably linking the display section Y to the main body section X and connected to the heat dissipating body (connection section 70a of the coolant channel 70) disposed in the thermally insulated space 6 inside the case 20.

The hinge section 30, as shown in FIG. 1, has a hollow structure and guiding of the tube 5a is conducted by passing it through the hollow portion. With such a configuration, no load accompanying the rotation operation is applied to the tube 5a and the tube can be guided between the main body section X and display section Y. Further, the guiding structure of the tube 5a in the hinge section 30 is not limited to the above-described structure, and any structure may be employed in which no load accompanying the rotation operation of the display section Y with respect to the main body section X is applied to the tube 5a.

A flexible tube such as a butyl rubber tube, a fluoropolymer tube, a fluorine rubber tube, or a silicone rubber tube can be used as the tube 5a. Because such flexible tubes have excellent flexibility, they can be easily guided when the notebook PC is assembled.

As described hereinabove, with the first embodiment of the present invention, because the heat dissipating body 7 is provided in the thermally insulated space 6, even when the amount of heat generated by the heat-generating body 2a is increases and the heat-dissipating body 7 is heated to a high temperature, the risk of heating the display unit 21 or case 20 located in the vicinity of the heat-dissipating body 7 is avoided. Therefore, even if the amount of heat generated in the heat-generating body 2a is increased, the risk of the display unit 21 being thermally damages is avoided and the temperature of the external walls of the case 20 is comparatively easily maintained within the ergonomically preferred temperature range (for example, 40° C. or less).

Further, even when the temperature of the heat-dissipating body 7 rises, the heat thereof remains in the thermally insulated space and heat transfer to the display section case 20 or the like causes no concerns. Therefore, it is not necessary to cause the rotation of the fan 22 at an excessively high speed or to increase the size thereof. As a result, functionality and operation speed of the heat-generating body 2a can be improved without creating any obstacle for miniaturization and thickness reduction of electronic equipment.

Furthermore, because heat dissipation is conducted in a concentrated fashion by using the fan 22 in a comparatively limited space such as the thermally insulated space 6, cooling of the heat-dissipating body 7 and, therefore, the heat-generating body 2a can be conducted more efficiently.

In order to confirm the above-described effect of the present invention, the following test was conducted by using the structure of the first embodiment. Thus, the heat exchanger 7 was obtained by forming the coolant channel 70 ($h_1$: 3 mm, $w_1$: 10 mm) and fins 71 ($h_2$: 3 mm, $t_2$: 1 mm, $p_2$: 10 mm) in a copper heat transfer sheet with a thickness $t_3$=5 mm. When the heat exchanger was used in combination with a sirocco-type fan 22 (trade name UDQFMMH01, manufactured by Kyushu Matsushita Co., Ltd.) in the case a notebook PC was driven at a room temperature (25° C.), the temperature of the heat-generating body 2a was 70° C. and the surface temperature of the fins 71 was 65° C., but the temperature of the outer wall of the display section case 20 was 38° C. and was maintained within the ergonomically preferred temperature range. However, when a notebook PC having the conventional cooling structure (a structure in which heat-dissipating fins directly provided on the heat-generating body 2a are forcibly cooled with the air by using a fan) was driven under the same conditions (room temperature), the temperature of the heat-generating body 2a was 70° C., the surface temperature of the heat-dissipating fins was 60° C., and the outer wall temperature of the display section case 20 in the vicinity of heat-dissipating fins was about 50° C. Therefore, this temperature was difficult to maintain within the ergonomically preferred temperature range.

Figure 8:
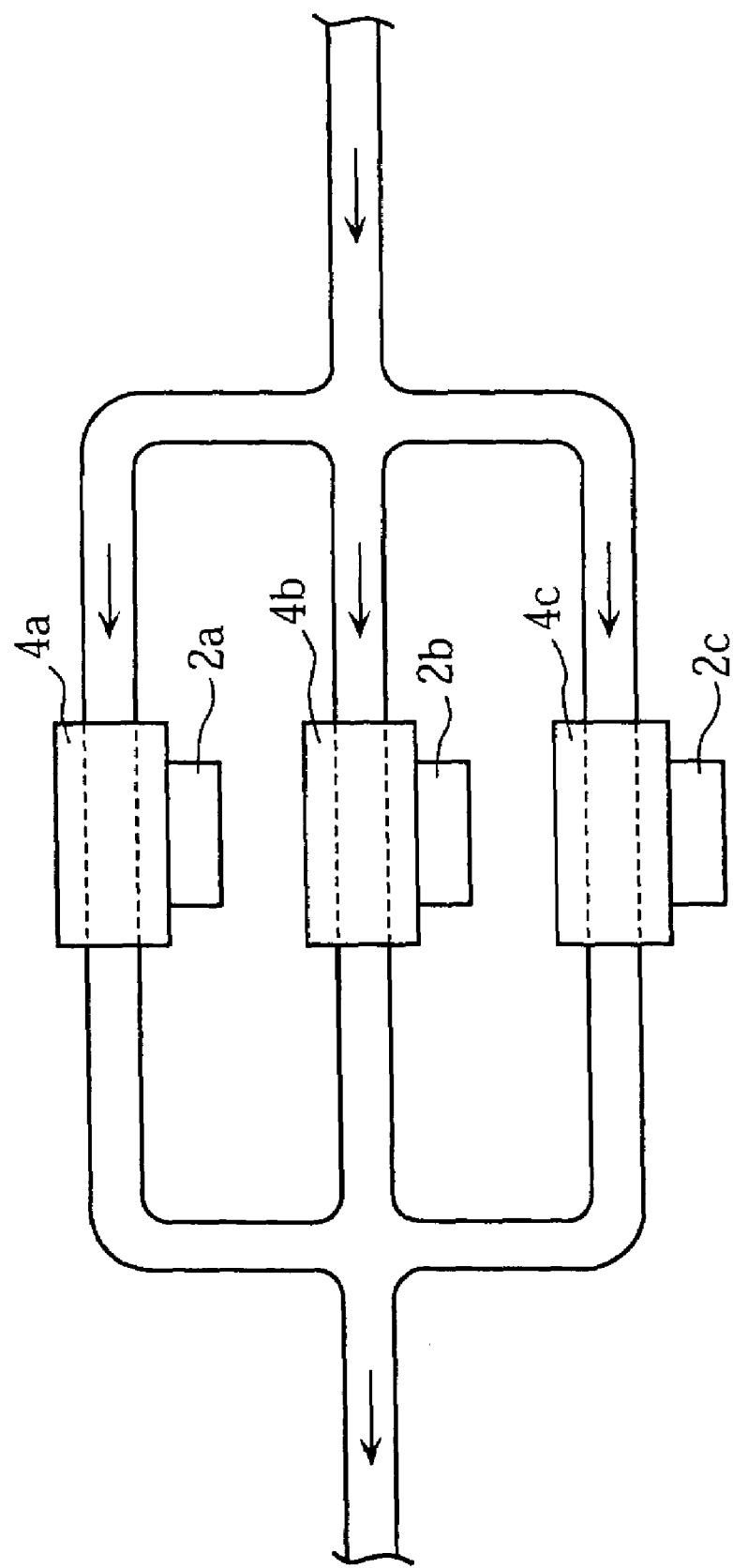
FIG. 8 is an enlarged view of the main portion illustrating a first modification example of the first embodiment.

In the above-described first embodiment, a coolant structure relating only to the heat-dissipating body 2a was explained. However, as shown in FIG. 8 illustrating the first modification example of the first embodiment, a configuration may be also employed in which two or more heat-generating bodies selected from a group composed of a plurality of heat-generating bodies $2a$, $2b$, $2c$ are cooled with a sequential cooling structure. In this case, in order to conduct the recovery of heat generated by the heat-generating bodies $2a$, $2b$, $2c$ with higher efficiency, the tube $5a$ is preferably so guided that the heat-receiving sections $4a$, $4b$, $4c$ corresponding to the heat-generating bodies $2a$, $2b$, $2c$ are arranged in a row. This is because with the sequential connection, the temperature of the cooling medium rises each time it passes through the heat-receiving section and the amount of heat that can be received by other heat-receiving sections decreases accordingly.

Figure 9:
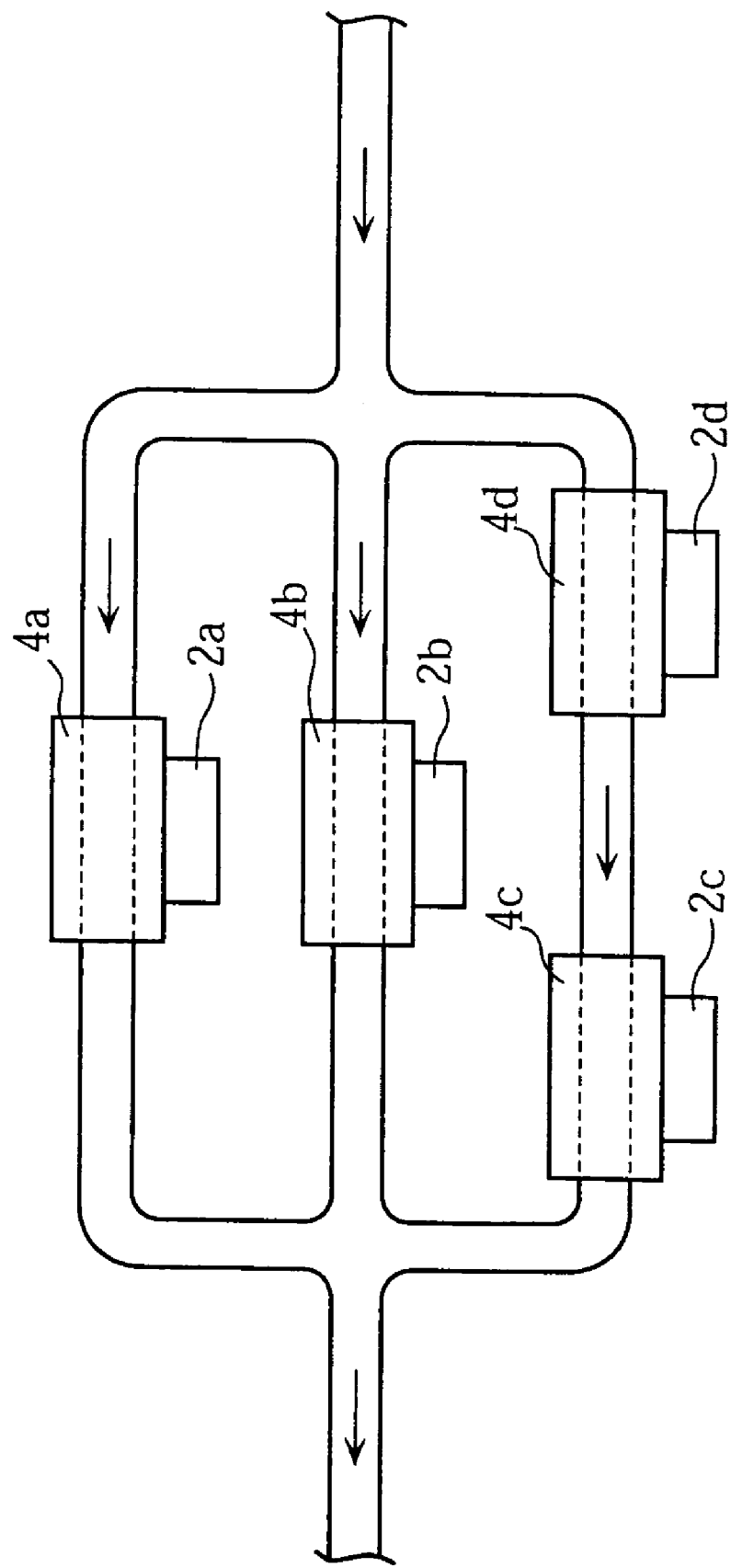
FIG. 9 is an enlarged view of the main portion illustrating a second modification example of the first embodiment.

Further, as shown in FIG. 9 illustrating the second modification example of the first embodiment, when some of the heat-generating bodies $2a$, $2b$, $2c$, $2d$ have to be arranged in series, it is preferred that they be so arranged that the heat-generating body (with a small heat generation amount (heat-generating body $2d$ in FIG. 9) be arranged on the upstream side. This is because if the amount of heat that can be received by the upstream heat-receiving body $4d$ is small, the amount of heat that is received by the downstream heat-receiving body $4c$ is increased accordingly.

In the above-described first embodiment, a Peltier element may be connected to the heat-dissipating body 7. The Peltier element has a heat-generating surface and heat-absorbing surface, the heat-generating surface side is open to the thermally insulated space 6 and the element is thermally and mechanically connected to the heat-dissipating body 7 via a thermally conductive paste on the heat-absorbing surface side. With such a configuration, the heat is pumped up from the heat-absorbing surface to the heat-generating surface and dissipated into the thermally-insulated space 6 under the effect of the Peltier element. Therefore, cooling can be conducted more efficiently than with the heat dissipation action of the fins 71.

Further, a Peltier element may be also introduced between the heat-generating body $2a$ and heat exchanger 4. In this case, the Peltier element is thermally and mechanically connected to the heat exchanger 4 via a thermally conductive paste on the heat-generating surface side and is thermally and mechanically connected to the heat-generating body $2a$ via a thermally conductive paste on the heat-absorbing surface side. With this configuration, too, cooling can be conducted with higher efficiency.

A system for controlling the drive power of the Peltier element may be also provided. This control system comprises monitoring means for monitoring the temperature of the heat-generating body $2a$, judgment means for judging as to whether or not the temperature of the heat-generating body $2a$ monitored with the monitoring means has reached the prescribed temperature, and control means for controlling the drive power of the Peltier element according to the judgment results obtained with the judgment means. With such a configuration, not only the power consumption of the Peltier element can be reduced, but also the amount of heat generated in the Peltier element can be reduced.

Figure 10:
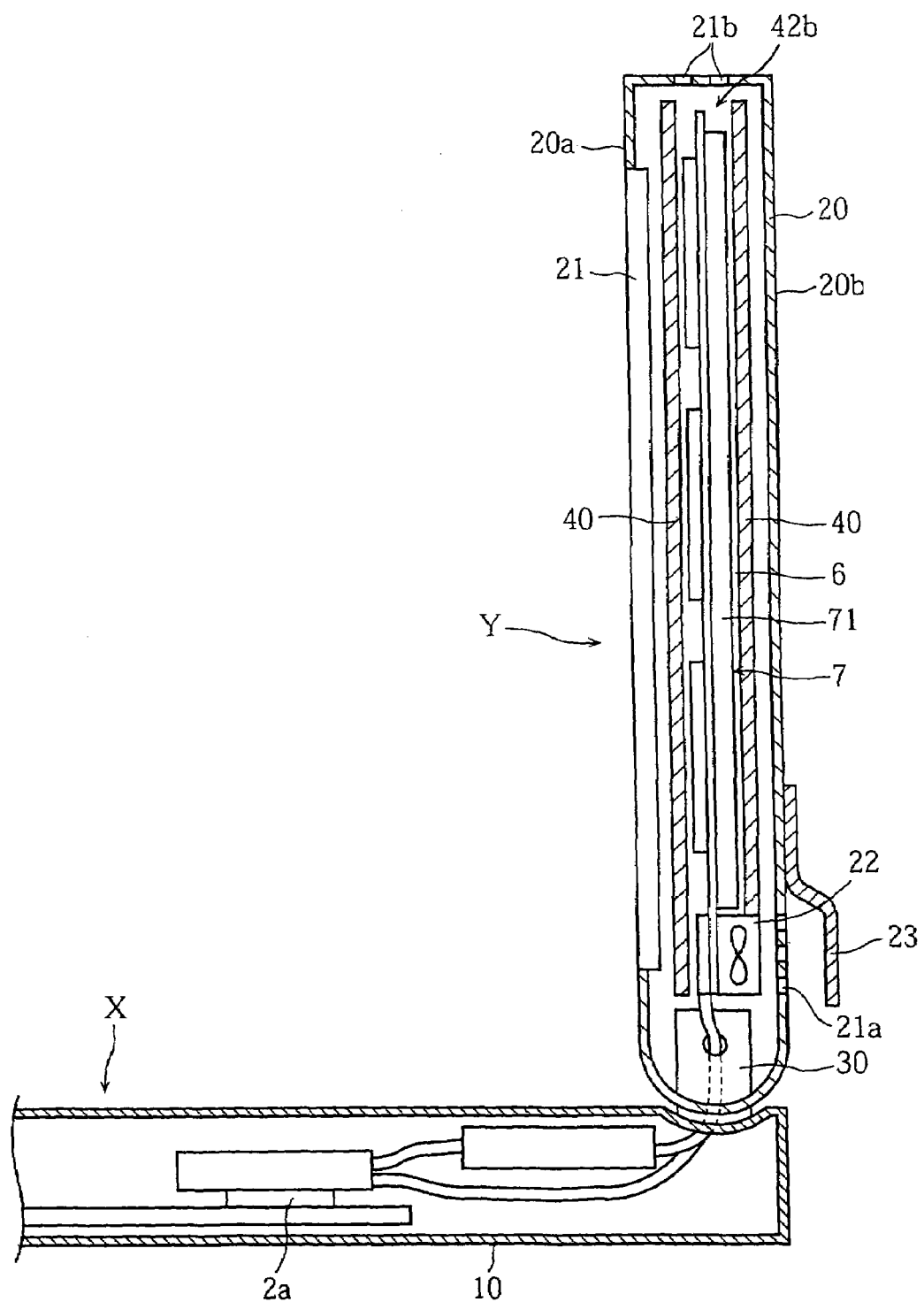
FIG. 10 is an enlarged side view of the main portion illustrating a third modification example of the first embodiment.
Figure 11:
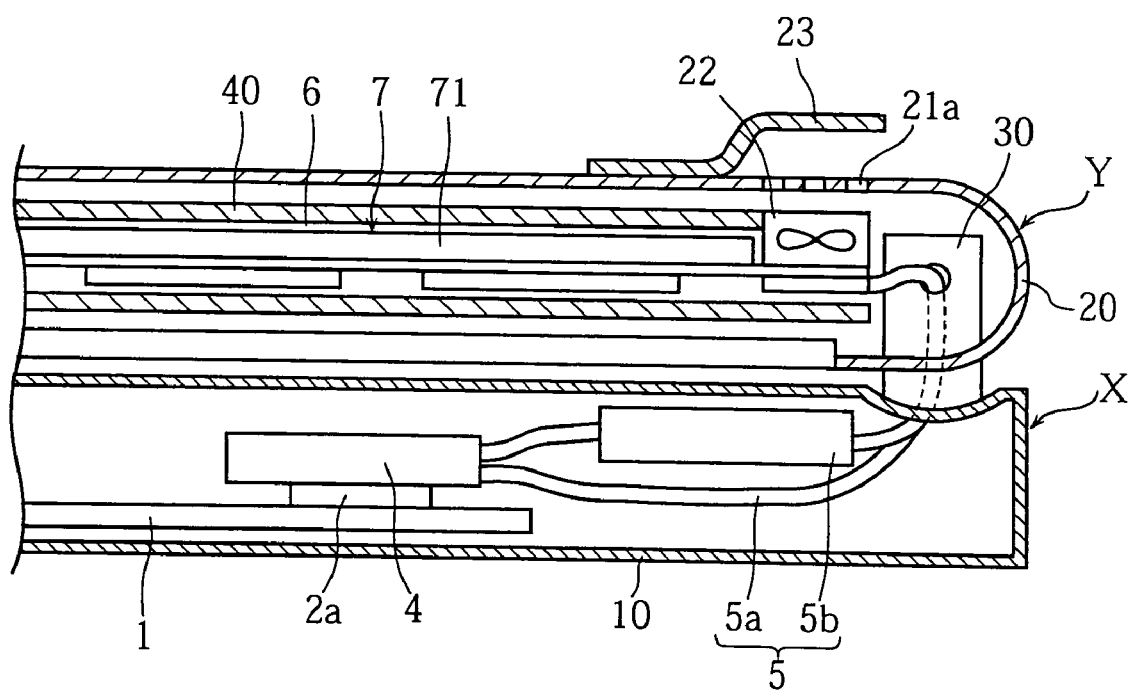
FIG. 11 is an enlarged side view of the main portion illustrating changes in the state of electronic equipment in the third modification example.

FIG. 10 and FIG. 11 illustrate the third modification example of the first embodiment. In the third modification example, a cover 23 is provided on the air intake opening $21a$ for introducing the cooling air into the thermally insulated space 6 via the fan 22. With such a configuration, as shown in FIG. 11, even when the air intake opening $21a$ faces up (that is, when the notebook PC is closed), the penetration of foreign matter into the display section case 20 can be prevented. Therefore, problems associated with the penetration of foreign matter into the case 20 (degradation of display unit 21 and the like) are prevented and reliability is improved.

Figure 12:
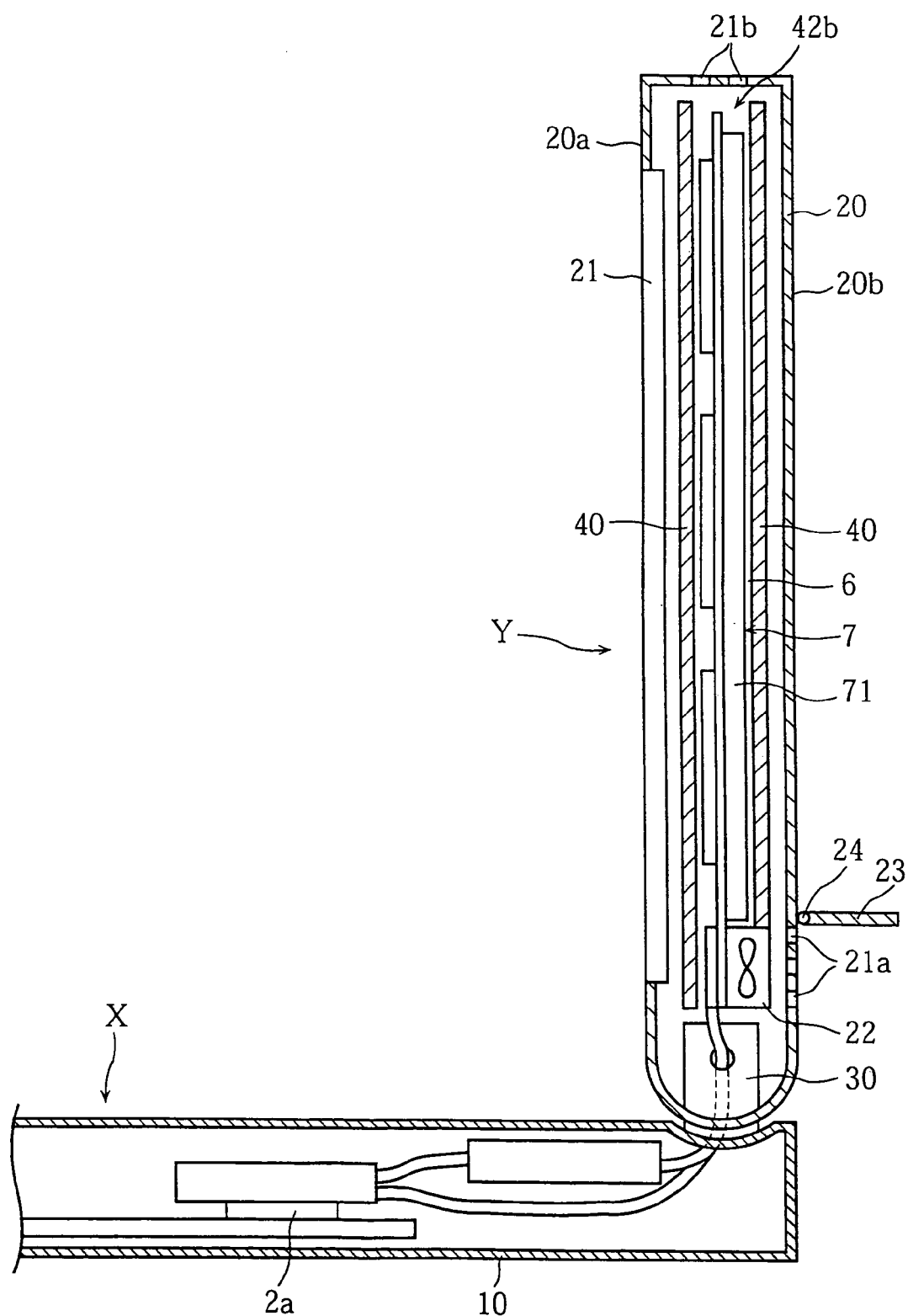
FIG. 12 is an enlarged side view of the main portion illustrating a fourth modification example of the first embodiment.
Figure 13:
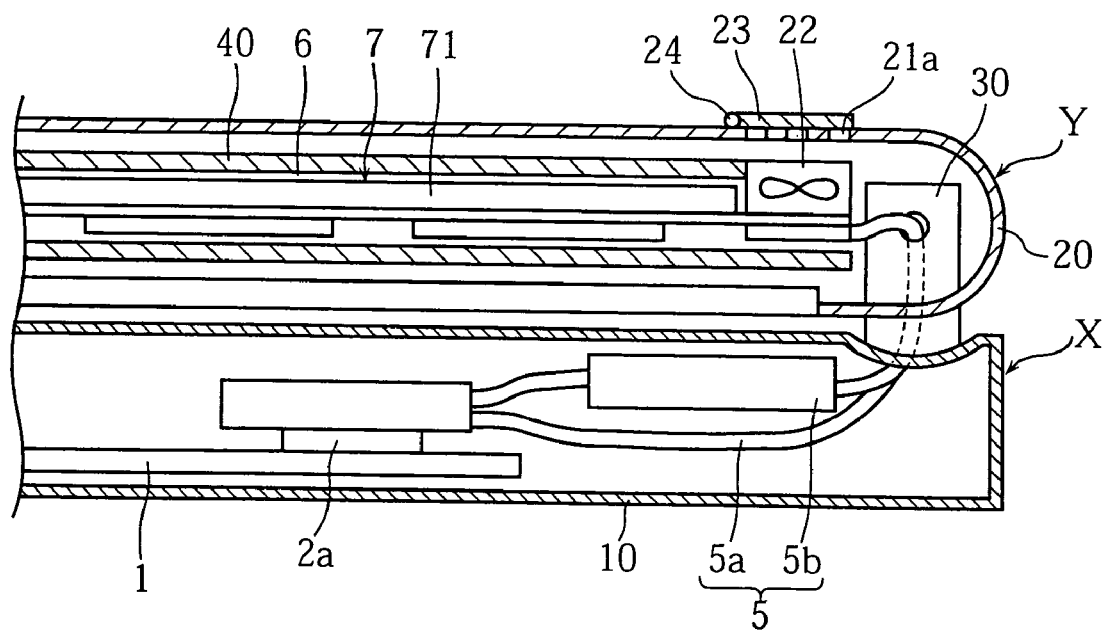
FIG. 13 is an enlarged side view of the main portion illustrating changes in the state of electronic equipment in the fourth modification example.

FIG. 12 and FIG. 13 illustrate the fourth modification example of the first embodiment. In the fourth modification example, a structure is provided in which the cover 23 can be rotated with respect to the display section casing 20 by introducing a hinge section 24 between the case 20 and cover 23. With such a structure, when the notebook PC is not used (see FIG. 12), the air intake opening 21 can be-closed with the cover 23 and the penetration of foreign matter into the case 20 can be suppressed more efficiently. Therefore, problems associated with the penetration of foreign matter are prevented more effectively and reliability is further improved.

Figure 14:
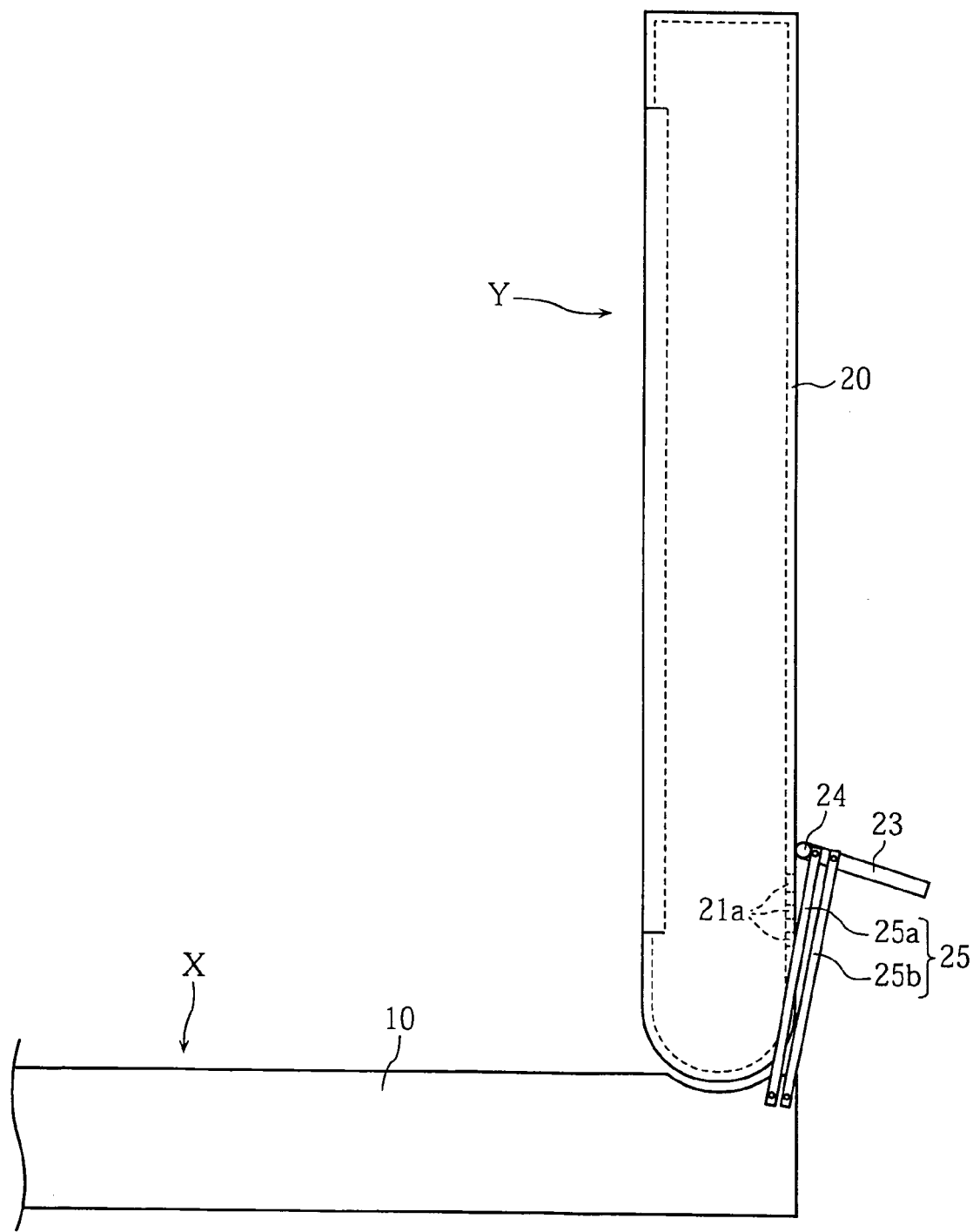
FIG. 14 is an enlarged side view of the main portion illustrating a fifth modification example of the first embodiment.
Figure 15:
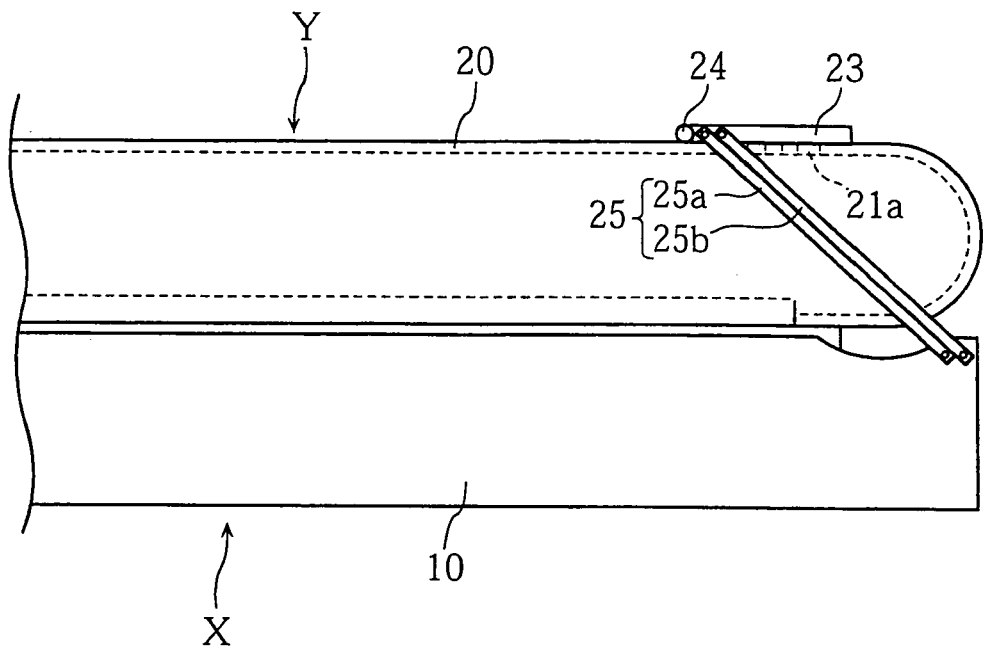
FIG. 15 is an enlarged side view of the main portion illustrating changes in the state of electronic equipment in the fifth modification example.

FIG. 14 and FIG. 15 illustrate the fifth modification example of the first embodiment. In the fifth modification example, a pair of links $25a$, $25b$ are inserted between the main body section case 10 and the cover 23 so attached to the display section case 20 that it can swing. More specifically, one end portion of each link $25a$, $25b$ is rotatably connected to the cover 23 and the other end portions thereof are rotatably connected to the main body section case 10. As a result, a parallel link mechanism 25 is formed by the pair of links $25a$, $25b$ and the cover 23 is opened and closed in connection with opening and closing of the display section Y. With such a configuration, when the display section Y is opened, it is not necessary to conduct a separate operation of opening the cover. Moreover, when the notebook PC is not used (a state in which the display section Y is closed), the air intake opening $21a$ can be automatically closed with the cover 23 and the penetration of foreign matter into the case 20 can be prevented more efficiently. Therefore, if the cover 23 having the above-described structure is provided, excellent reliability and also excellent convenience are obtained.

The cooling structure of the notebook PC of the second embodiment of the present invention will be described below in greater detail with reference to FIGS. 16 to 19. In those figures, members or elements identical or analogous to those of the above-described cooling structure are assigned with the same reference numerals and redundant explanation thereof is omitted.

Figure 16:
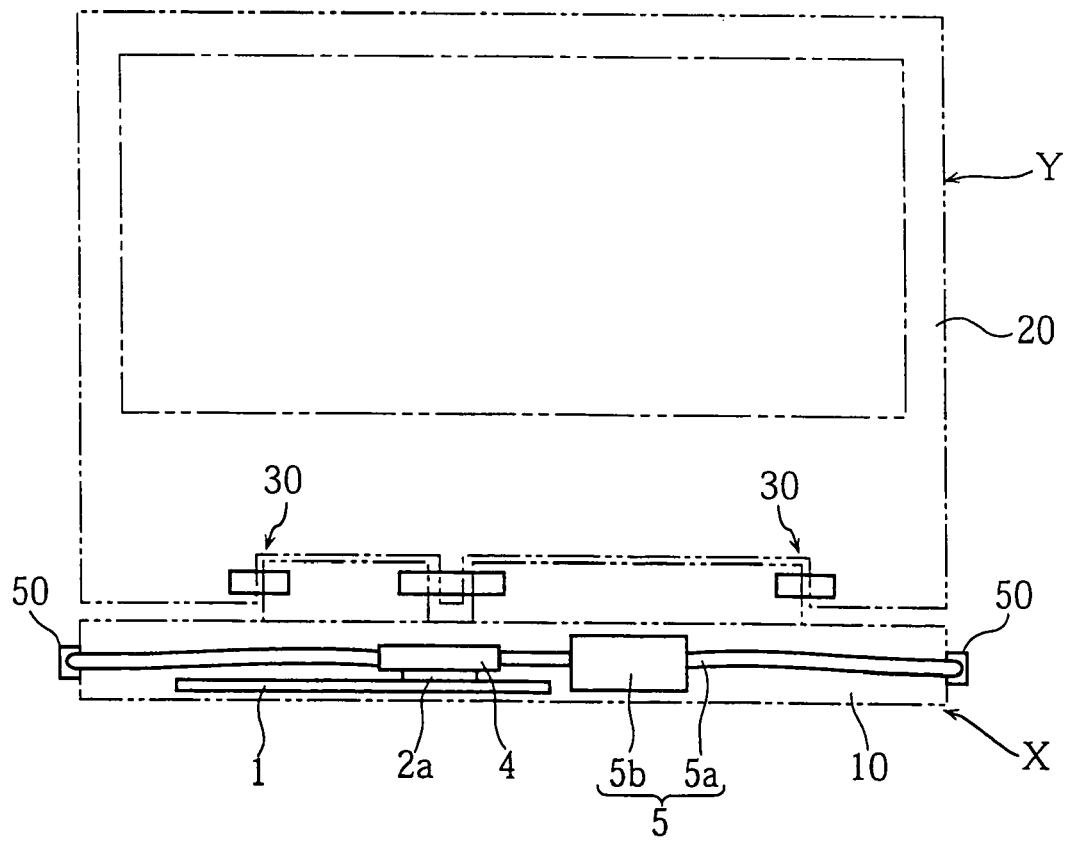
FIG. 16 is a schematic front view illustrating the cooling structure for electronic equipment of the second embodiment of the present invention.
Figure 17:
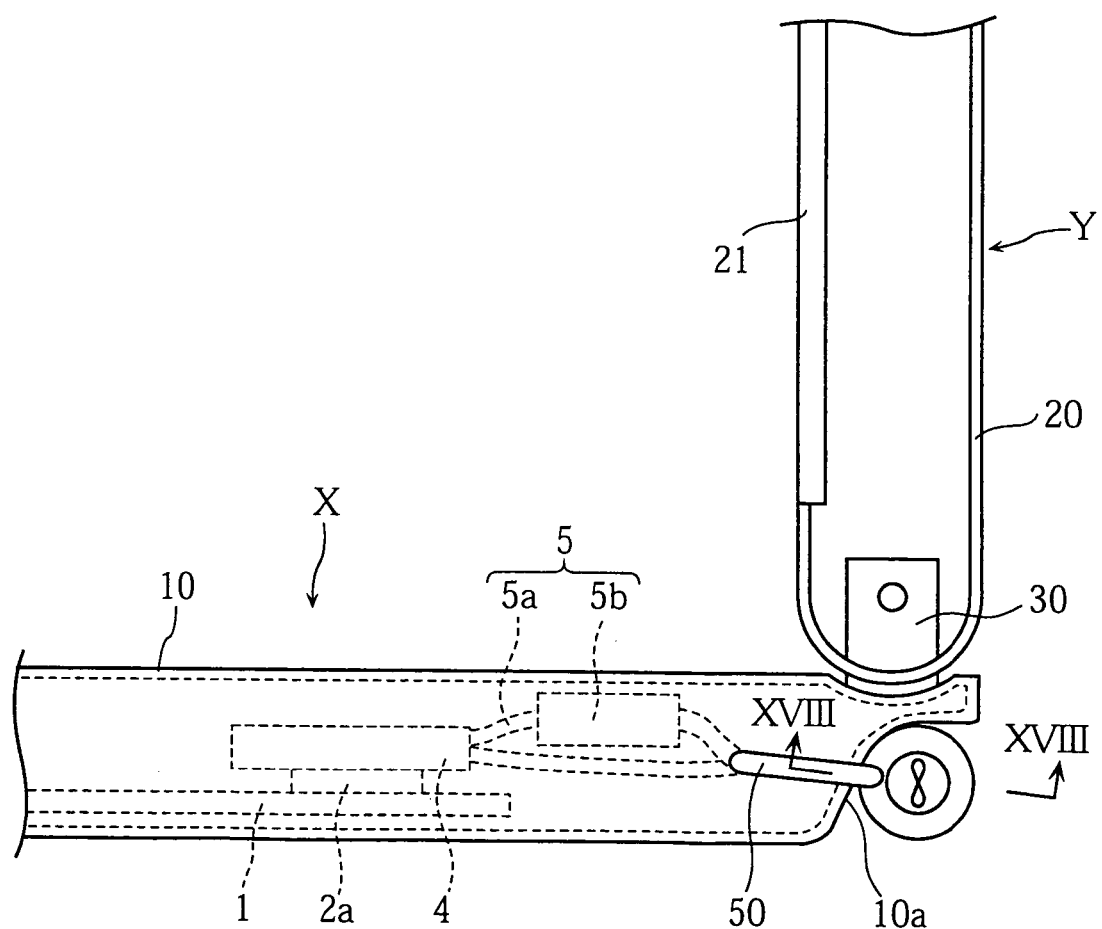
FIG. 17 is an enlarged side view of the main portion of the cooling structure shown in FIG. 16.
Figure 18:
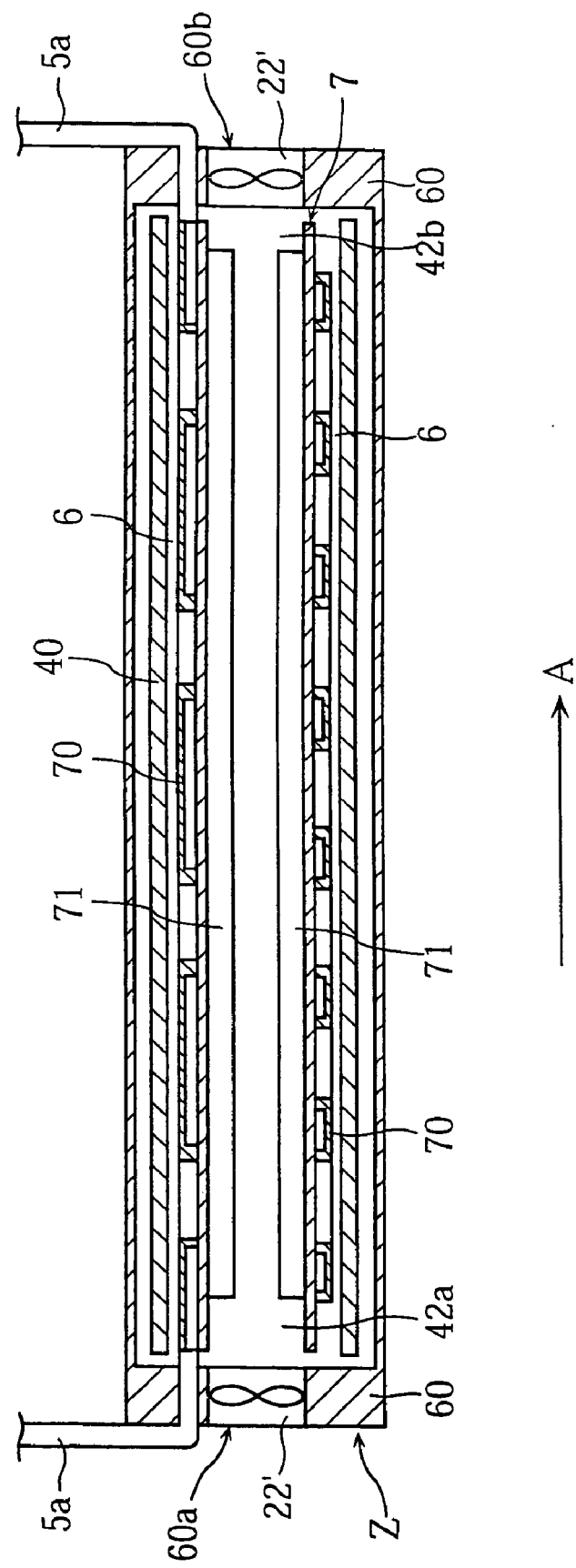
FIG. 18 is a cross-sectional view along the line XVIII—XVIII in FIG. 17.

FIG. 16 and FIG. 17 show a notebook PC composed of a main body section X, a display section Y rotatably linked to the main body section X, and a heat-dissipating section Z. FIG. 16 is a front view thereof and FIG. 17 is a side view thereof. FIG. 18 is a cross-sectional view along the line XVIII—XVIII shown in FIG. 17. In FIG. 16, the outer contour of a case 10 of the main body section X and the outer contour of a case 20 of the display section Y are shown by two-dot-dash lines.

The main body section X, as shown in FIG. 16, comprises a circuit substrate 1 and a heat-generating body $2a$ inside the case 10. In the second embodiment, the explanation is conducted with respect to the case of cooling only the heat-generating body $2a$, but even when a plurality of heat-generating bodies are cooled, the cooling can be conducted by the same method as described in the first modification example (FIG. 8) and second modification example (FIG. 9) of the first embodiment.

As shown in FIG. 16, a heat-receiving section 4 is thermally joined to the heat-generating body $2a$ via a thermally conductive paste (not shown in the figure). The heat-receiving section 4 is provided to transfer the heat recovered from the heat-generating body $2a$ to heat transfer means 5.

In the second embodiment, too, the explanation will be conducted by using a structure in which a heat exchanger is used as the heat-receiving section 4, a tube 5a is filled with a coolant as the heat transfer means 5, and the coolant is circulated by using a coolant pump 5b. No specific limitation is placed on the heat-receiving section 4 and heat transfer means 5.

In the cooling structure of the present embodiment, the tube 5a connected to the heat exchanger 4 and filled with the coolant is guided inside a case 60 of the heat-dissipating section Z via the pump 5b for coolant circulation and a hinge section 50 (see FIG. 16 and FIG. 17) for rotatably linking the heat-dissipating section Z to the main body section X and connected to the heat-dissipating body 7 disposed in a thermally insulated space 6 provided inside the case 60. As a result, the heat generated by the heat-generating body 2a is recovered and transported by the coolant circulating inside the heat exchanger 4 thermally joined to the heat-generating body 2a, and the heat is released to the outside of the notebook PC from the heat-dissipating body 7.

A thermally insulating structural body 40 regulating the thermally insulated space 6 is provided, as shown in FIG. 18, inside the heat-dissipating section case 60. The heat-dissipation section case 60 has a tubular shape and comprises an air inlet orifice 60a at one end thereof and an air release orifice 60b at the other end. Similarly, the thermally insulating structural body 40 also has a tubular shape open at both ends thereof and has a two-layer thermally insulating structure shown in FIG. 4 (this structure is not clearly represented in FIG. 18). One end section of the thermally insulating structural body 40 serves as an inflow orifice 42a for causing the cooling air to flow into the thermally insulated space 6 via the air inlet orifice 60a of the case 60, and the other end section serves as an outflow orifice 42b for releasing the air to the outside via the air release orifice 60b of the case 60. Further, axial flow fans 22' for causing the cooling air to flow in the direction of arrow A are installed in the air inlet orifice 60a and air release orifice 60b of the case 60. The axial-flow fan 22' may be also provided only in one of the air inlet orifice 60a and air release orifice 60b.

As shown in FIG. 18, a heat exchanger serving as the heat-dissipating body 7 is disposed in the thermally insulated space 6. The heat exchanger 7 comprises a coolant channel 70 and a plurality of fins 71 extending in the air flow direction (direction of arrow A).

Figure 19:
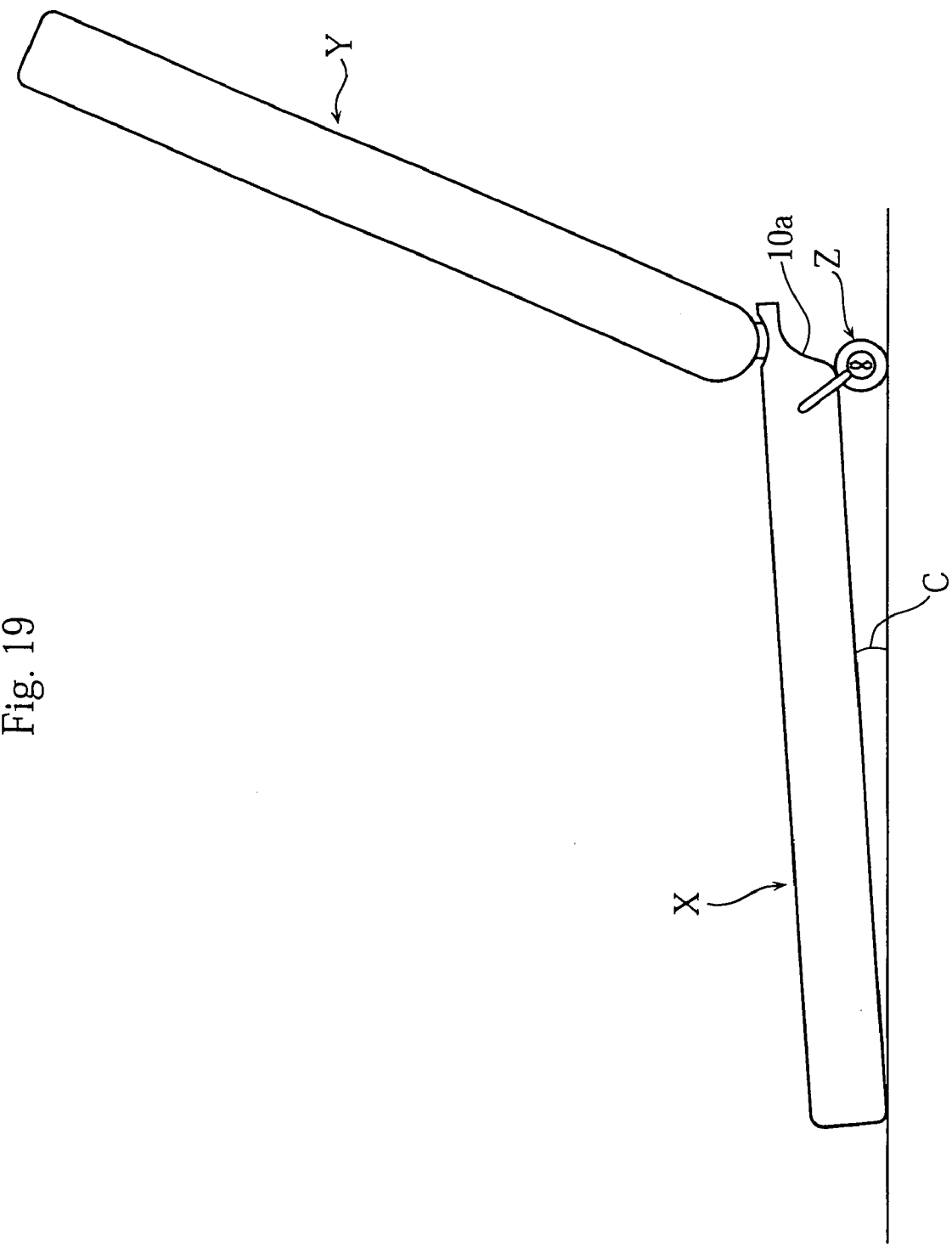
FIG. 19 is a schematic side view illustrating changes in the state of electronic equipment shown in FIG. 16.

The cooling operation principle of the second embodiment comprising the above-described structure is almost identical to that of the above-described first embodiment and, therefore, the explanation thereof is omitted. In the second embodiment the heat-dissipating section Z is linked so that it can swing via a hinge section 50 with respect to the main body section X. Therefore, it can additionally demonstrate a function of a tilt mechanism. Thus, if the heat-dissipating section Z is caused to swing from the accommodation state shown in FIG. 17 with respect to the main body section X and, as shown in FIG. 19, the main body section is supported in a tilted state, then an appropriate angle C can be provided to the main body section X and operability of the notebook PC is increased. Further, as shown in FIG. 17, in a state in which the heat-dissipating section is accommodated behind the main body section X, an interface connector (not shown in the figure) provided on the rear surface 10a of the case 10 of the main body section X is in a covered state and, as shown in FIG. 19, the connector can be exposed by swinging the heat-dissipating section Z with respect to the main body section X. Therefore, the heat-dissipating section Z can also additionally function as a connector cover.

Figure 20:
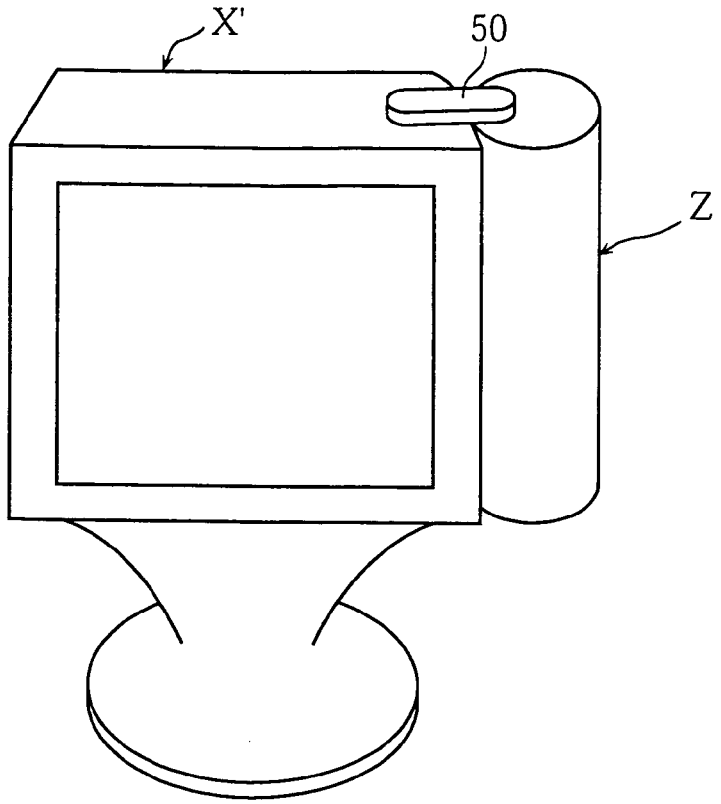
FIG. 20 is a perspective view illustrating a first modification example of the second embodiment.
Figure 21:
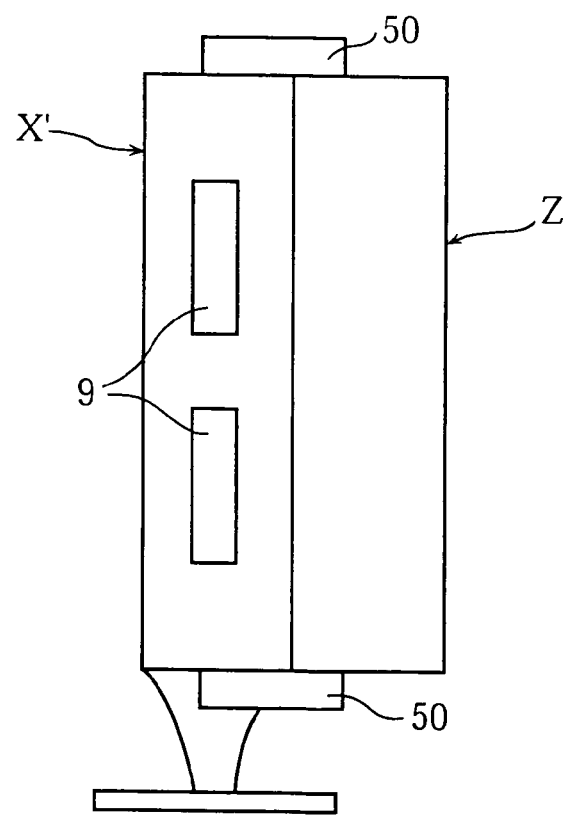
FIG. 21 is a schematic side view illustrating changes in the state of electronic equipment shown in the first modification example.

FIG. 20 and FIG. 21 show a modification example of the second embodiment. In this modification example, the cooling structure shown in FIGS. 16 to 19 is applied to a space-saving PC. This desktop PC comprises a main body section X' also serving as a display section, and this main body section X' also serving as a display section comprises a slot section 9 such as a floppy disk drive or card slot in the side section on one side thereof. A heat-dissipating section Z is linked so that it is free to swing via a hinge section 50 with respect to the main body section X' also serving as a display section. The space-saving PC also comprises a wireless keyboard (not shown in the figure). The cooling structure related to the heat-dissipating section Z is almost identical to that shown in FIGS. 16 to 19 and the explanation thereof is omitted.

With this modification example, a state in which the slot section 9 is covered with the heat-dissipating section Z, as shown in FIG. 20, and a state in which the heat-dissipating section Z is caused to swing with respect to the main body section X' also serving as a display section and the slot section 9 is exposed can be selected. Therefore, in addition to a cooling function, the heat-dissipating section Z also has a function of a slot cover for protecting the slot section 9.

The cooling structure of the space-saving PC of the third embodiment of the present invention will be described below in greater detail with reference to FIGS. 22 to 29. In those figures, members or elements identical or analogous to those of the above-described cooling structure are assigned with the same reference numerals and redundant explanation thereof is omitted.

Figure 22:
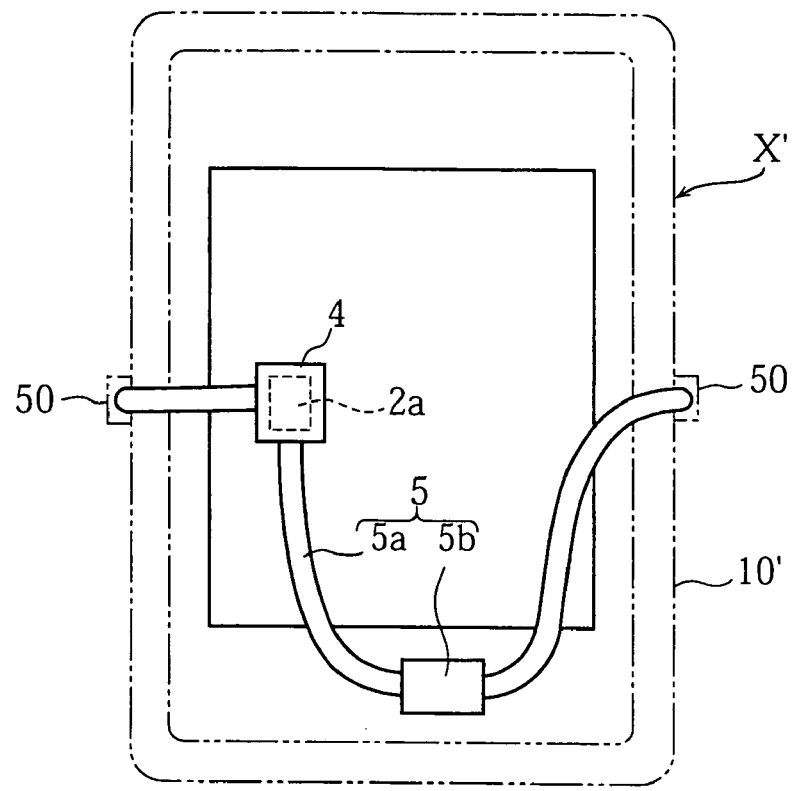
FIG. 22 is a schematic front view illustrating the cooling structure for electronic equipment of the third embodiment of the present invention.
Figure 23:
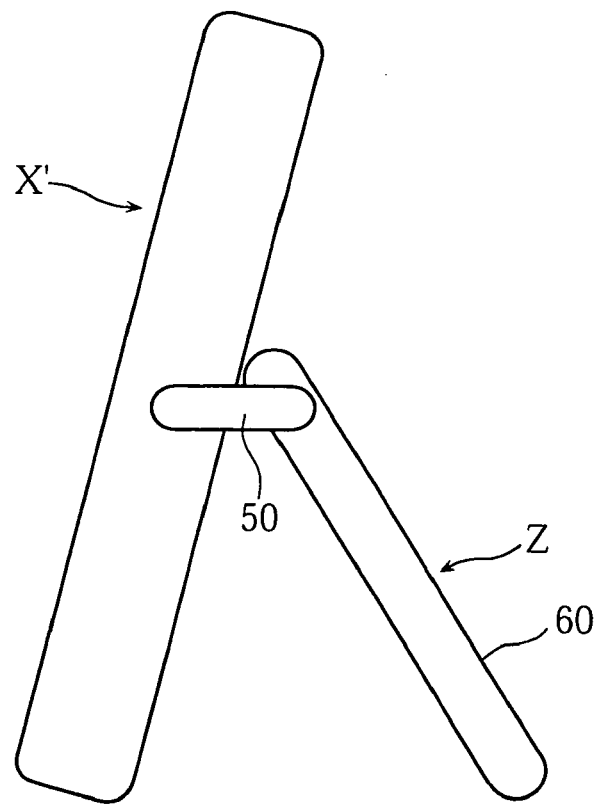
FIG. 23 is a right side view of the electronic equipment shown in FIG. 22.
Figure 24:
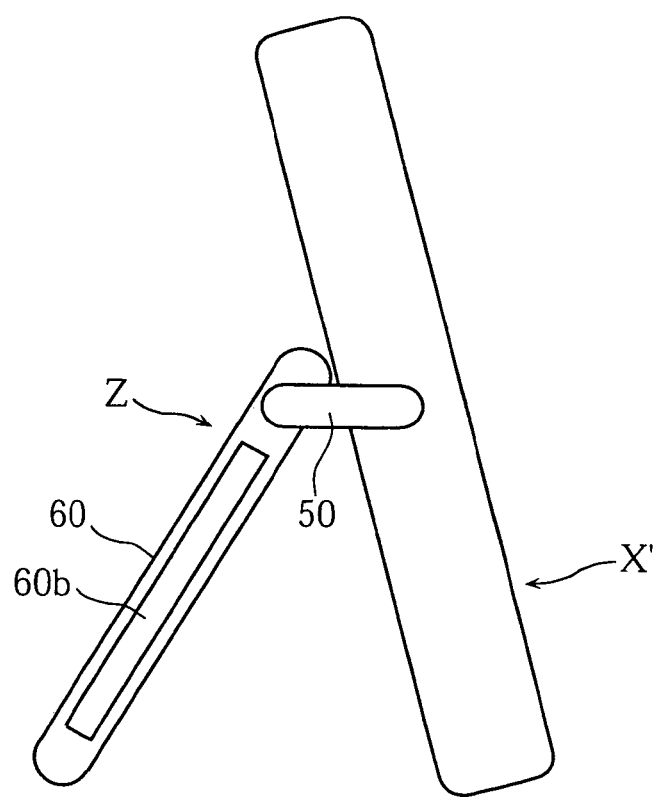
FIG. 24 is a left side view of the electronic equipment shown in FIG. 22.
Figure 25:
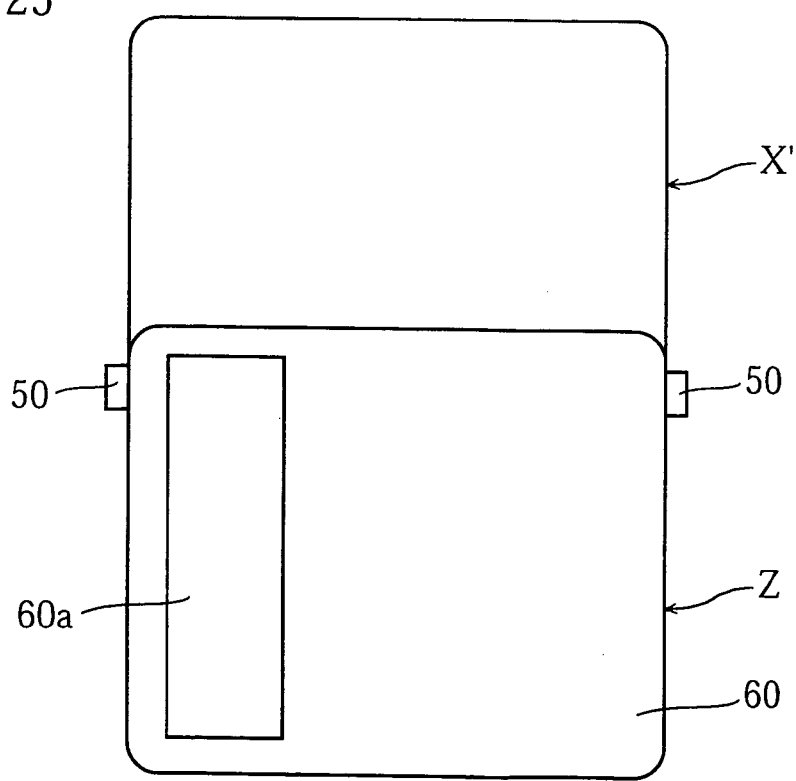
FIG. 25 is a rear view of the electronic equipment shown in FIG. 22.
Figure 26:
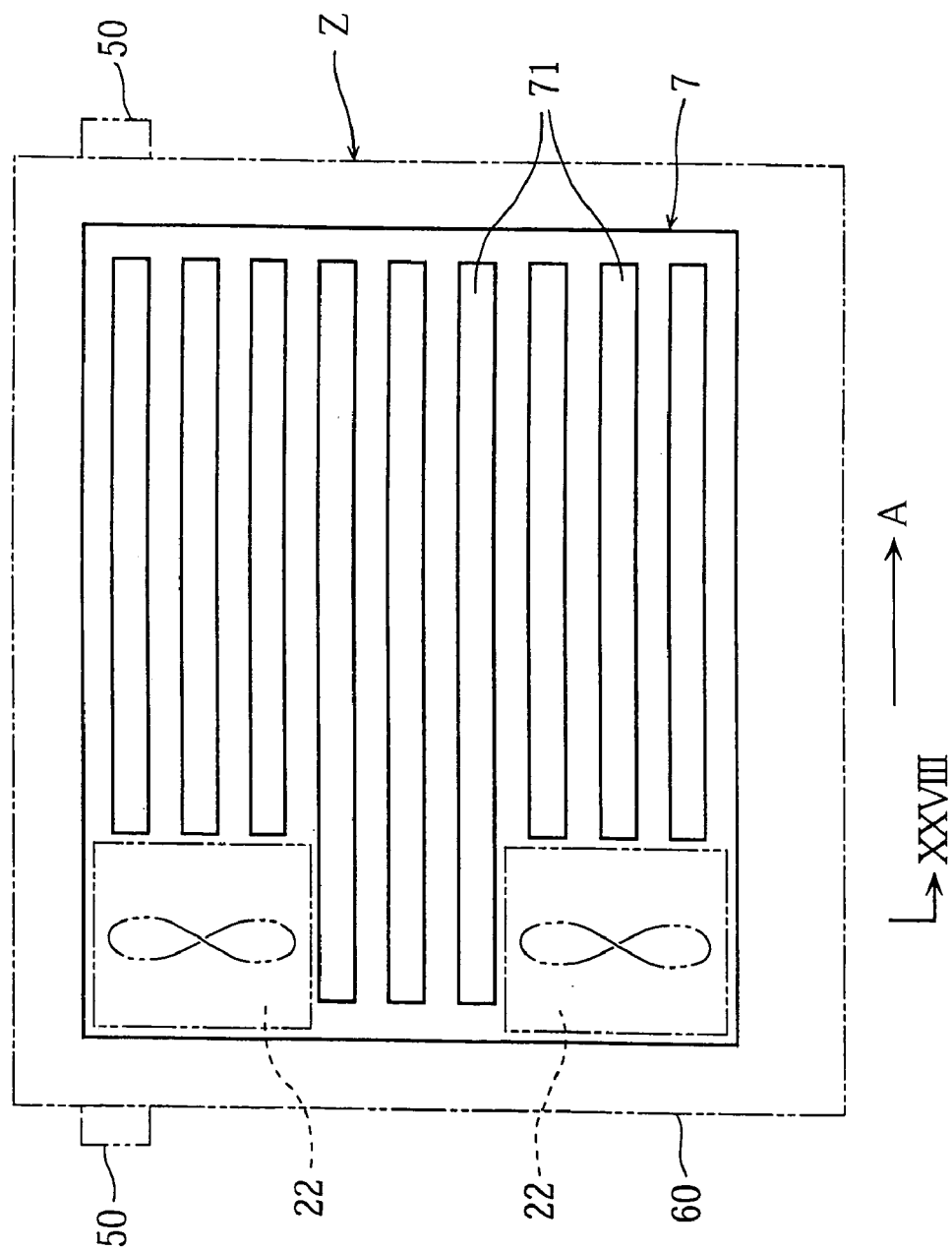
FIG. 26 is a enlarged front view of the main portion of the cooling structure shown in FIG. 22.
Figure 27:
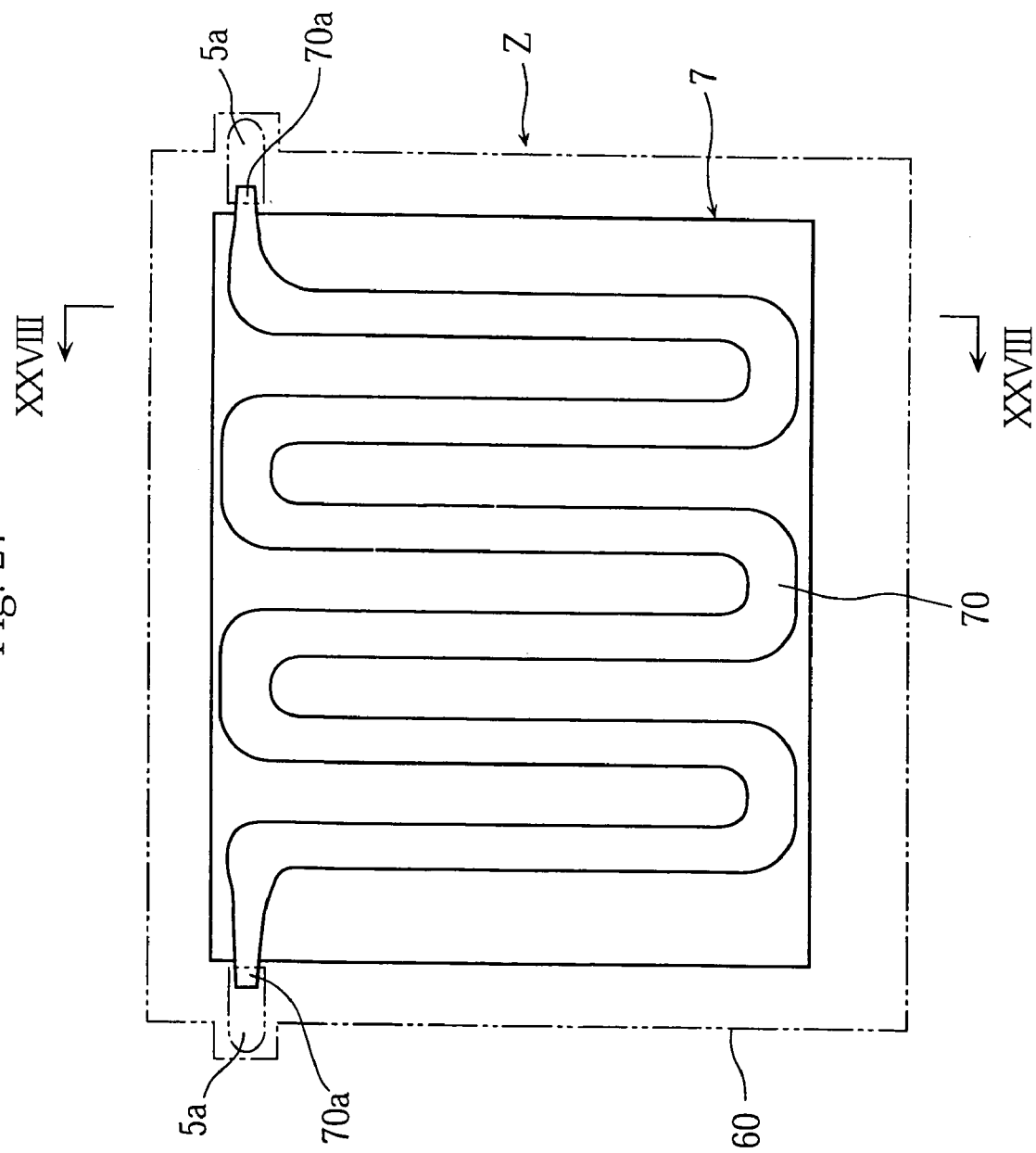
FIG. 27 is a is an enlarged rear view of the main portion of the cooling structure shown in FIG. 22.
Figure 28:
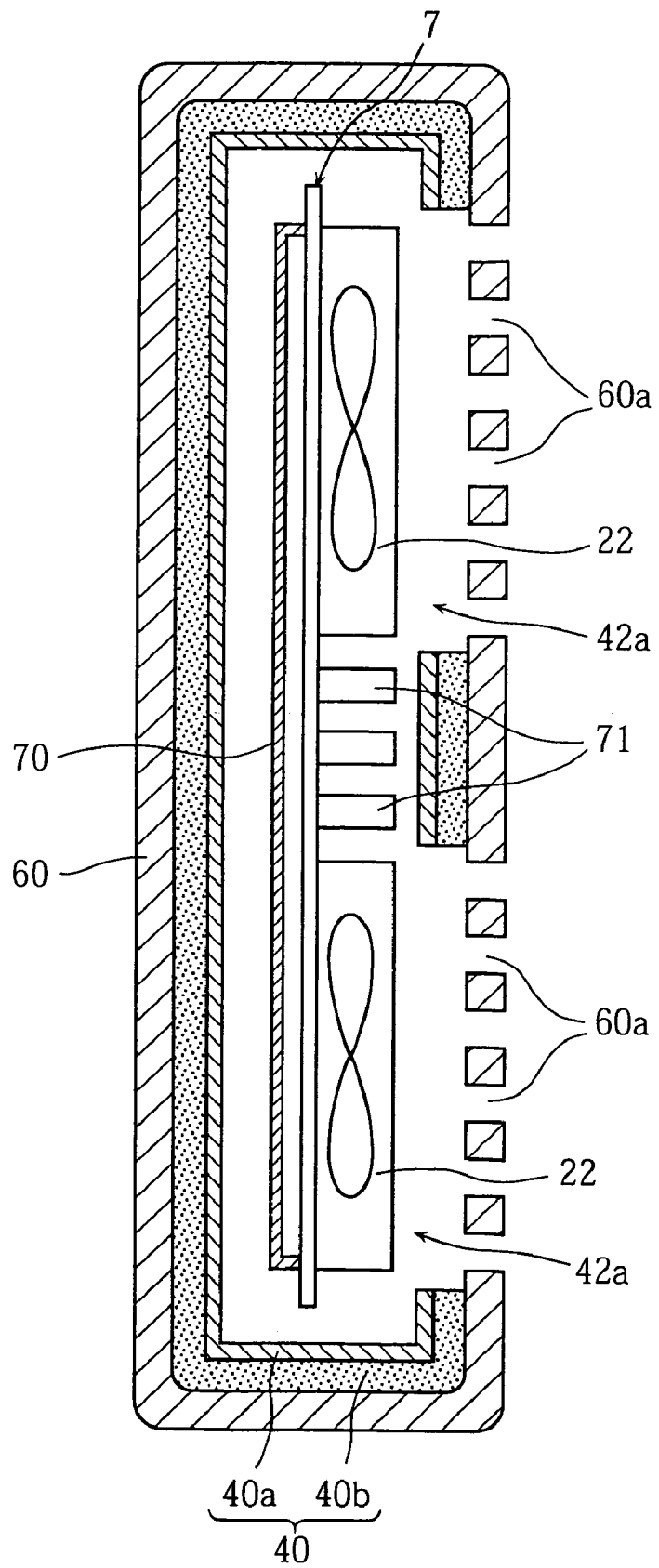
FIG. 28 is a cross-sectional view along the line XXVIII—XXVIII in FIG. 26 and FIG. 27.

FIGS. 22 to 25 are schematic views of he space-saving PC composed of the main body section X' also serving as a display section and the heat-dissipating section Z rotatably linked to the main body section X' also serving as a display section. FIG. 22 is a front view thereof, FIG. 23 is a right side view thereof, FIG. 24 is a left side view thereof, and FIG. 25 is a rear view thereof. Further, FIGS. 26 and 27 are the enlarged schematic views of the heat-dissipating section Z, FIG. 26 is the front view thereof, and FIG. 27 is a rear view thereof. FIG. 28 is a cross-sectional view along the line XXVIII—XXVIII shown in FIG. 26 and FIG. 27. In FIG. 22, the outer contour of a case 10' of the main body section X' also serving as a display section, and in FIG. 26 and FIG. 27, the outer contour of the case 60 of the heat-dissipating section Z and the hinge section 50 are shown by two-dot-dash lines.

The main body section X' also serving as a display section, as shown in FIG. 22, comprises a circuit substrate 1 and a heat-generating body 2a inside the case 10'. In the third embodiment, too, the explanation is conducted with respect to the case of cooling only the heat-generating body 2a, but even when a plurality of heat-generating bodies are cooled, the cooling can be conducted by the same method as described in the first modification example (FIG. 8) and second modification example (FIG. 9) of the first embodiment.

As shown in FIG. 22, a heat-receiving section 4 is thermally joined to the heat-generating body 2a via a thermally conductive paste (not shown in the figure). The heat-receiving section 4 is provided to transfer the heat recovered from the heat-generating body 2a to heat transfer means 5.

In the third embodiment hereinbelow, the explanation will be conducted by using a structure in which a heat exchanger is used as the heat-receiving section 4, a tube 5a is filled with a coolant as the heat transfer means 5, and the coolant is circulated by using a coolant pump 5b. No specific limitation is placed on the heat-receiving section 4 and heat transfer means 5.

In the cooling structure of the third embodiment, the tube 5a connected to the heat exchanger 4 and filled with the coolant is guided inside a case 60 of the heat-dissipating section Z via the pump 5b for coolant circulation and a hinge section 50 (see FIGS. 22 to 27) for rotatably linking the heat-dissipating section Z to the main body section X' also serving as a display section and connected to the heat-dissipating body 7 disposed in a thermally insulated space 6 provided inside the case 60. As a result, the heat generated by the heat-generating body 2a is recovered and transported by the coolant located inside the heat exchanger 4 thermally joined to the heat-generating body 2a, and the heat is released to the outside of the notebook PC from the heat-dissipating body 7.

A thermally insulated space 6 is regulated, as shown in FIG. 28, by a thermally insulating structural body 40 comprising an air channel inside thereof. The two-layer structure of the thermally insulating structural body 40 is almost identical to that of the first embodiment and explanation thereof is, therefore, omitted. The thermally insulating structural body 40 is open at both ends thereof. One end section thereof serves as an inflow orifice 42a for causing the cooling air to flow into the thermally insulated space 6 via the air inlet orifice 60a (see FIG. 25) provided in the case 60, and the other end section serves as an outflow orifice (not shown in the figure) for releasing the air to the outside via the air release orifice 60b (see FIG. 24) provided in the case 60. Further, fans 22 are installed in the air inlet orifice 60a, as shown in FIG. 28. In the configuration shown in FIG. 28, two fans 22 are installed, but the number of installed fans is not limited thereto, and one or three and more fans may be installed. Furthermore, the installation position of the fans 22 is not limited to the vicinity of the air inlet orifice 60a, and they may be installed, for example, in the vicinity of the air release orifice 60b.

As shown in FIG. 28, a heat exchanger serving as the heat-dissipating body 7 is disposed in the thermally insulated space 6. The heat exchanger 7 comprises a coolant channel 70 (see FIG. 27) and a plurality of fins 71 (see FIG. 26) extending in the air flow direction (direction of arrow A).

In the cooling structure of the above-described third embodiment, too, the heat generated by heat-generating body 2a is guided to the thermally insulated space 6 and concentrated cooling is conducted therein. Therefore, the same advantages as those of the cooling structure of the first embodiment can be obtained. Furthermore, because the case 60 of the heat-dissipating section Z has also a function of a tilt leg for supporting the main body section X' also serving as a display section in a tilted state, it is not necessary to use additionally a separate case for cooling.

The cooling structure of the notebook PC of the fourth embodiment of the present invention will be described below in greater detail with reference to FIGS. 29 to 32. In those figures, the elements identical or analogous to those of the above-described cooling structure of the notebook PC or space-saving PC are assigned with the same reference numerals and redundant explanation thereof is omitted.

Figure 29:
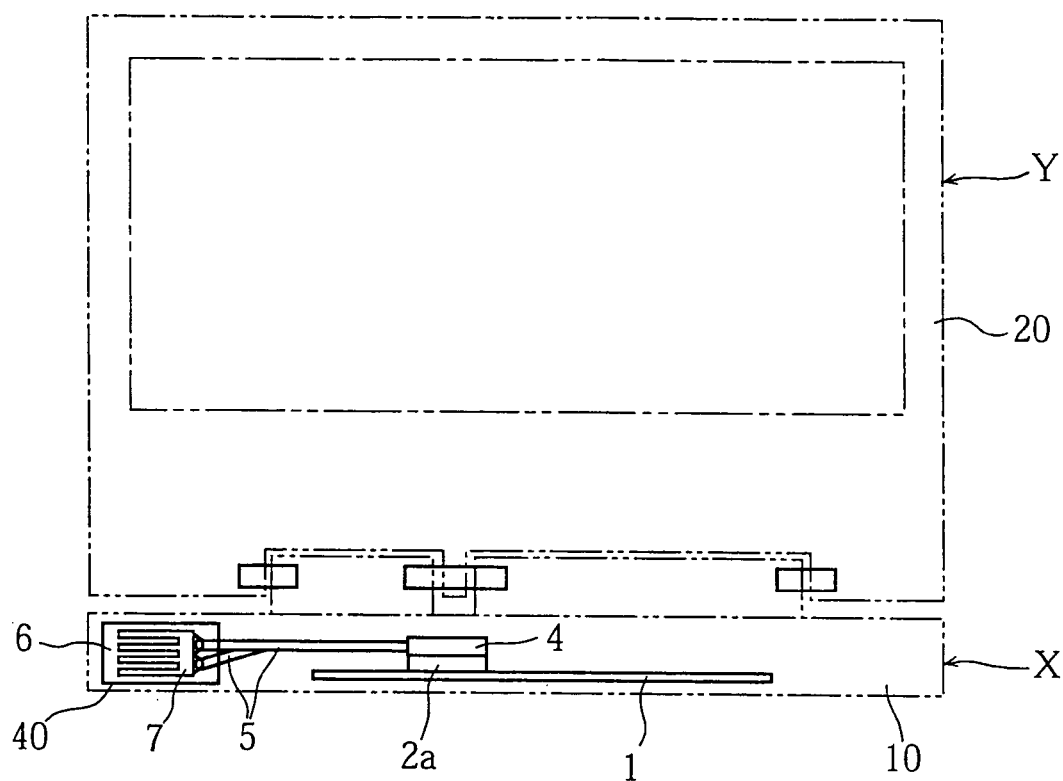
FIG. 29 is a schematic front view illustrating the cooling structure for electronic equipment of the fourth embodiment of the present invention.
Figure 30:
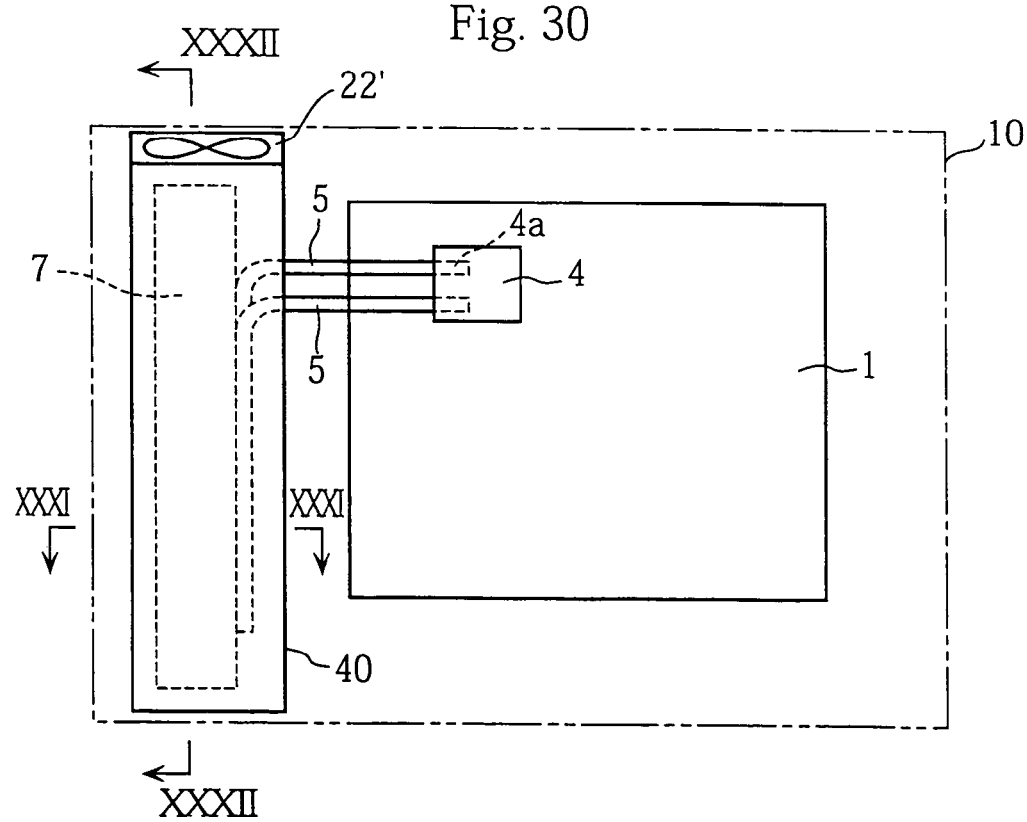
FIG. 30 is a enlarged plan view of the main portion of the cooling structure shown in FIG. 29.
Figure 31:
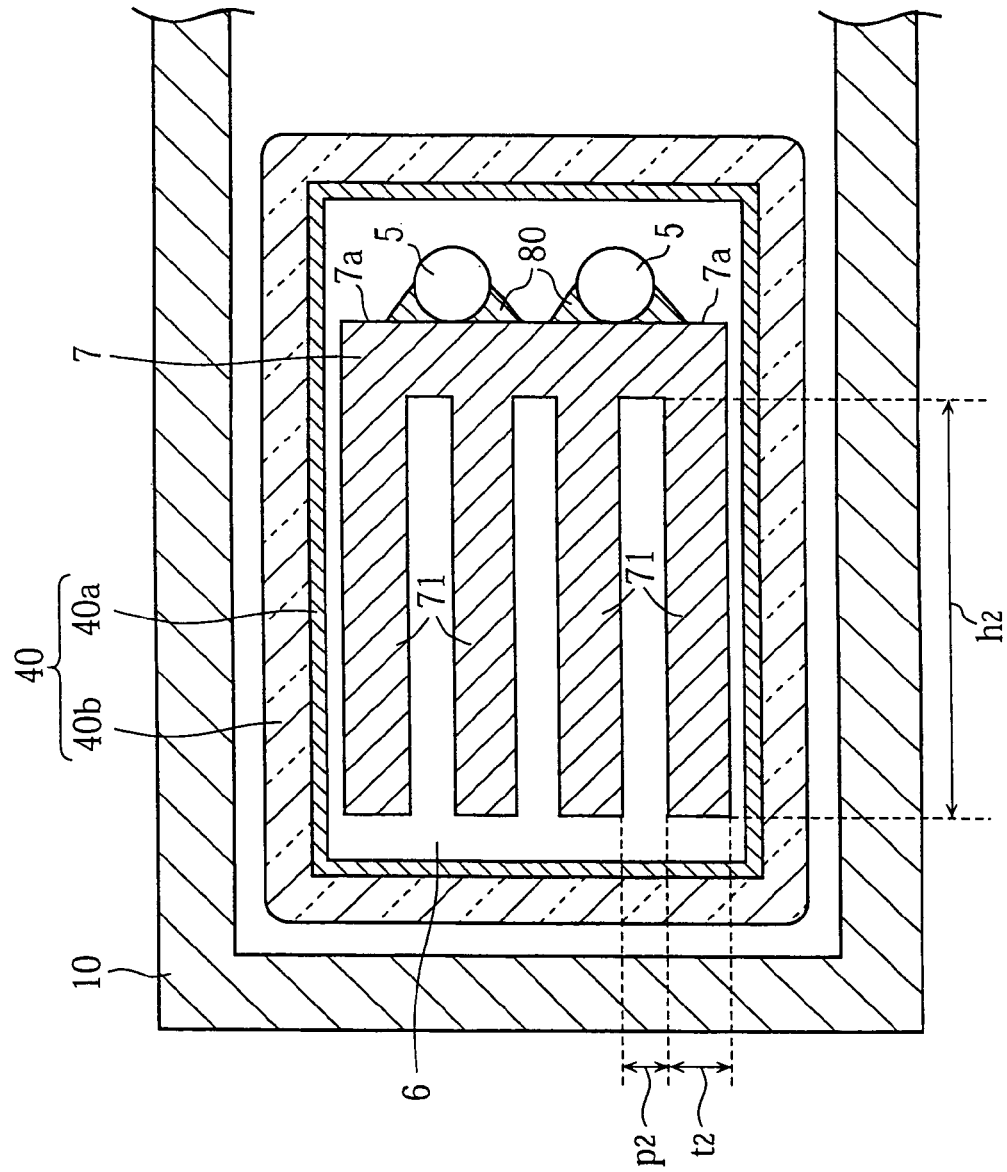
FIG. 31 is a cross-sectional view along the line XXXI—XXXI in FIG. 30.
Figure 32:
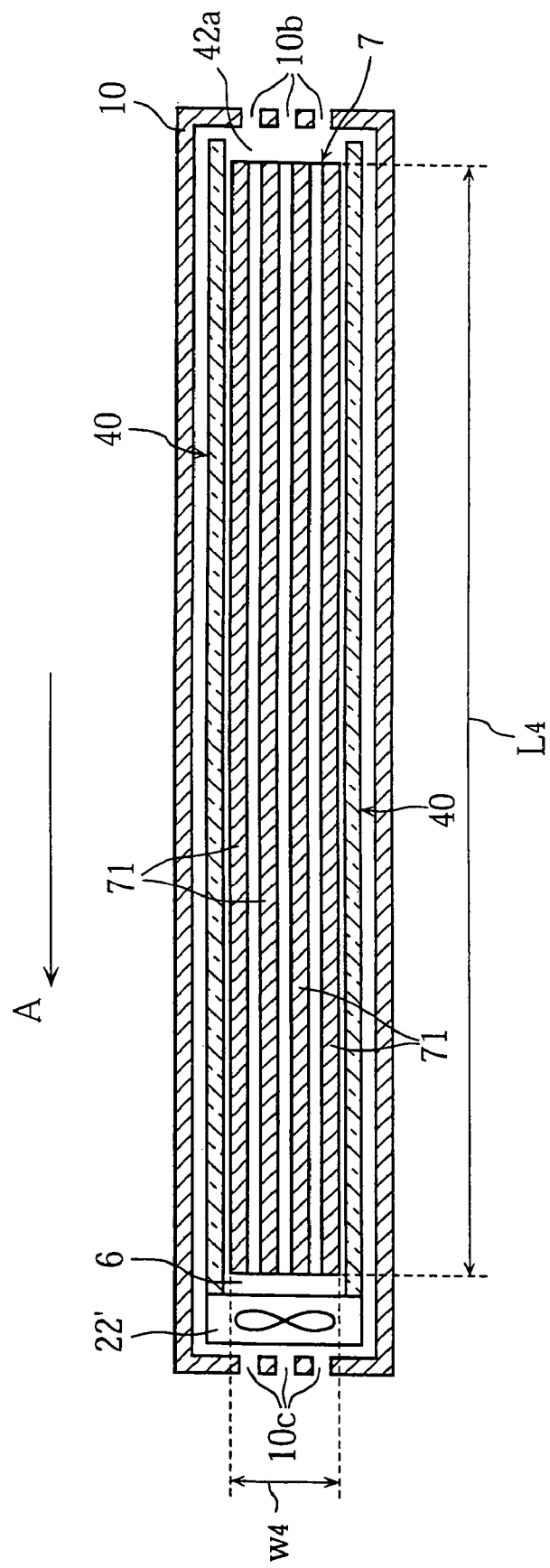
FIG. 32 is a cross-sectional view along the line XXXII—XXXII in FIG. 30.

FIG. 29 is a front view of a notebook PC composed of a main body section X and a display section Y rotatably linked to the main body section X. FIG. 30 is a front view of the main body section X. FIG. 31 is a cross-sectional view along the line XXXI—XXXI shown in FIG. 30. FIG. 32 is a cross-sectional view along the line XXXII—XXXII shown in FIG. 30. In FIGS. 29 and 30, the outer contour of a case 10 of the main body section X and the outer contour of a case 20 of the display section Y are shown by two-dot-dash lines.

The main body section X, as shown in FIG. 29, comprises a circuit substrate 1 and a heat-generating body 2a inside the case 10. In the present embodiment, the explanation is conducted with respect to the case of cooling only the heat-generating body 2a, but even when a plurality of heat-generating bodies are cooled, the cooling can be conducted by the same method as described in the first modification example (FIG. 8) and second modification example (FIG. 9) of the first embodiment.

As shown in FIG. 29, a heat-receiving section 4 is thermally joined to the heat-generating body 2a via a thermally conductive paste (not shown in the figure). The heat-receiving section 4 is provided to transfer the heat recovered from the heat-generating body 2a to heat transfer means 5.

In the present embodiment the explanation will be conducted by employing a heat transfer block as the heat-receiving section 4 and a heat pipe as the heat transfer means 5, but the heat-receiving section 4 and heat transfer means 5 are not limited thereto. Further, an orifice 4a enabling the insertion of one end section of the heat pipe is provided, as shown in FIG. 30, in the heat transfer block 4.

With the cooling structure of the present embodiment, the heat generated from the heat-generating body 2a is recovered and transported by the heat pipe 5 connected by one end section thereof to the heat transfer block 4 via the heat transfer block 4 thermally joined to the heat-generating body 2a and released to the outside of the notebook PC from the heat-dissipating body 7 connected to the other end section of the heat pipe 5 and disposed in the thermally insulated space provided in the case 10 of the main body section.

The heat transfer block 4 and heat pipe 5 can be connected to each other, for example, by a method comprising the steps of inserting one end section of the heat pipe 5 and welding or soldering the heat transfer block 4 and heat pipe 5. However, the method for joining the heat transfer block 4 and heat pipe 5 is not limited to the above-described method. For example, the heat transfer block and heat pipe 5 can be connected via a thermally conductive adhesive. Further, in order to improve heat transfer performance, if a gap is formed between the heat transfer block 4 and heat pipe 5 when the two are connected, it is preferred that a thermally conductive paste be introduced into the gap.

The heat-dissipating body 7 and heat pipe 5 can be connected, for example, as shown in FIG. 31, by bringing the other end section of the heat pipe 5 into contact with the plane section 7a of the heat-dissipating body 7 and soldering the heat-dissipating body 7 and heat pipe 5 with a solder 80. Other suitable methods for connecting the heat-dissipating body 7 and heat pipe 5 include a method of bonding the heat-dissipating body 7 and heat pipe 5 together with a thermally conductive adhesive, a method of welding the heat-dissipating body 7 and heat pipe 5, a method of providing a groove in the plane section 7a of the heat-dissipating body 7 and press fitting the heat pipe 5 into the groove, and a method of placing the heat pipe 5 onto the plane section 7a of the heat-dissipating body 7 and then covering the heat pipe 5 with a thin sheet of a metal, and bonding the heat-dissipating body 7, heat pipe, and thin metal sheet with a thermally conductive adhesive. Further, in order to improve heat transfer performance, if a gap is formed between the heat-dissipating body 7 and heat pipe 5 when the two are connected, it is preferred that a thermally conductive paste be introduced into the gap.

A thermally insulated space 6 is regulated, as shown in FIG. 31, by a thermally insulating structural body 40 comprising an air channel inside thereof and composed of an inner wall section 40*a* and an outer wall section 40*b*. The thermally insulating structural body 40 is not limited to the above-described double-wall structure and may be composed of any one wall.

As shown in FIG. 32, the thermally insulating structural body 40 regulating the thermally insulated space 6 is open at both ends thereof. One end section thereof serves as an inflow orifice 42*a* for causing the cooling air to flow into the thermally insulated space 6 via the air inlet orifice 10*b* provided in the case 10, and the other end section serves as an outflow orifice 42*b* for releasing the air to the outside via the air release orifice 10*c* provided in the case 10. Further, an axial flow fan 22' for causing the air to flow in the direction of arrow A is installed in the air release orifice 10*c*. The axial-flow fan 22' may be also provided in the air inlet orifice 10*b* or both in the air intake orifice 10*b* and air release orifice 10*c*.

As shown in FIG. 32, the heat-dissipating body 7 disposed in a thermally insulated space 6 (total length $L_4$, total width $w_4$) has a plurality of fins 71 (height $h_2$, thickness $t_2$, pitch $p_2$) extending along the air flow direction (direction of arrow AB).

In the cooling structure of the fourth embodiment having the above-described configuration, a test was conducted by driving a notebook PC having the cooling structure of the present embodiment at room temperature (25° C.) by using, for example, a heat-dissipating body 7 ($L_4$: 200 mm, $W_4$: 30 mm) having fins 71 ($h_2$: 30 mm, $t_2$: 1 mm, $p_2$: 2 mm) and an axial-flow fan 22' (trade name UDQFBDB01, manufactured by Kyushu Matsushita Co., Ltd.). The results demonstrated that the temperature of the heat-generating body 2*a* was 70° C., the surface temperature of the fins 71 was 60° C., but the outer wall temperature of the case 10 was 35° C. and was held within the ergonomically preferred range. However, the notebook PC having the conventional cooling structure (a structure in which the heat-dissipating fins directly provided on the heat-generating body 2*a* are forcibly cooled with a fan) was driven under the same conditions (room temperature), the temperature of the heat-generating body 2*a* was 70° C., the surface temperature of the heat-dissipating fins was 60° C., and the outer wall temperature of the case 10 in the vicinity of the heat-dissipating fins was about 50° C. Therefore, the temperature was difficult to held within the ergonomically preferred temperature range.

Further, a Peltier element (trade name FPH1-12707T, manufactured by Fujitaka Co.) was introduced between the heat-generating body 2*a* and heat exchanger 4 and the notebook PC having the cooling structure described in the present embodiment was driven at room temperature (25° C.) by the same method as was described in the first embodiment. In this case the surface temperature of fins 71 was 60° C., but the surface temperature of the heat-generating body 2*a* could be reduced to 30° C. Therefore, when the heat-generating body 2*a* is a CPU, the operational capability of the CPU can be further improved.

The present invention is described hereinabove based on specific embodiments thereof, but the present invention is not limited thereto and various modifications thereof can be made without deviating from the spirit of the present invention described in the appended claims.

The invention claimed is:

1. A cooling structure for electronic equipment for cooling at least one heat-generating body disposed inside a case by recovering heat generated by the heat-generating body and dissipating the heat out of the case, the cooling structure comprising:
   a heat-receiving section for recovering heat generated at the heat-generating body;
   a thermally insulated space provided with an air inflow orifice and an air outflow orifice and thermally insulated from the heat-generating body and the heat-receiving section by a thermally insulating member;
   a heat-dissipating section provided inside the thermally insulated space;
   heat transfer means for transferring the heat recovered by the heat-receiving section to the heat-dissipating section; and
   a fan for generating forcibly an air flow inside the thermally insulated space;
   wherein the heat generated by the heat-generating body is transferred to the heat-dissipating section via the heat-receiving section and the heat transfer means and dissipated by using the fan inside the thermally insulated space; and
   wherein the thermally insulated space is provided inside a separate case connected to an outside of the case via the heat transfer means.

2. A cooling structure for electronic equipment for cooling at least one heat-generating body disposed inside a case by recovering heat generated by the heat-generating body and dissipating the heat out of the case, the cooling structure comprising:
   a heat-receiving section for recovering heat generated at the heat-generating body;
   a thermally insulated space provided with an air inflow orifice and an air outflow orifice and thermally insulated from the heat-generating body and the heat-receiving section by a thermally insulating member;
   a heat-dissipating section provided inside the thermally insulated space;
   heat transfer means for transferring the heat recovered by the heat-receiving section to the heat-dissipating section; and
   a fan for generating forcibly an air flow inside the thermally insulated space;
   wherein the heat generated by the heat-generating body is transferred to the heat-dissipating section via the heat-receiving section and the heat transfer means and dissipated by using the fan inside the thermally insulated space; and
   wherein the thermally insulated space is provided in a tilt mechanism having a function of tilting the case.

3. A cooling structure for electronic equipment for cooling at least one heat-generating body disposed inside a case by recovering heat generated by the heat-generating body and dissipating the heat out of the case, the cooling structure comprising:
   a heat-receiving section for recovering heat generated at the heat-generating body;
   a thermally insulated space provided with an air inflow orifice and an air outflow orifice and thermally insulated from the heat-generating body and the heat-receiving section by a thermally insulating member;
   a heat-dissipating section provided inside the thermally insulated space;
   heat transfer means for transferring the heat recovered by the heat-receiving section to the heat-dissipating section; and
   a fan for generating forcibly an air flow inside the thermally insulated space;

wherein the heat generated by the heat-generating body is transferred to the heat-dissipating section via the heat-receiving section and the heat transfer means and dissipated by using the fan inside the thermally insulated space; and wherein the thermally insulated space is provided in a protective cover having a function of protecting a connector and/or a slot.

4. A cooling structure for electronic equipment for cooling at least one heat-generating body disposed inside a case by recovering heat generated by the heat-generating body and dissipating the heat out of the case, the cooling structure comprising:

a heat-receiving section for recovering heat generated at the heat-generating body;

a thermally insulated space provided with an air inflow orifice and an air outflow orifice and thermally insulated from the heat-generating body and the heat-receiving section by a thermally insulating member;

a heat-dissipating section provided inside the thermally insulated space;

heat transfer means for transferring the heat recovered by the heat-receiving section to the heat-dissipating section; and a fan for generating forcibly an air flow inside the thermally insulated space;

wherein the heat generated by the heat-generating body is transferred to the heat-dissipating section via the heat-receiving section and the heat transfer means and dissipated by using the fan inside the thermally insulated space; and wherein the heat-dissipating section is connected to a heat-absorbing surface of a Peltier element, the Peltier element including a heat-generating surface exposed to the thermally insulated space.

5. The cooling structure for electronic equipment according to claim 4, further comprising:

monitoring means for monitoring a temperature of the heat-generating body;

judgment means for judging as to whether or not the temperature of the heat-generating body monitored by the monitoring means has reached a prescribed temperature; and control means for controlling drive power of the Peltier element, a pump contained in the heat transfer means, and the fan by using judgment results obtained at the judgment means.

6. A cooling structure for electronic equipment for cooling at least one heat-generating body disposed inside a case by recovering heat generated by the heat-generating body and dissipating the heat out of the case, the cooling structure comprising:

a heat-receiving section for recovering heat generated at the heat-generating body;

a thermally insulated space provided with an air inflow orifice and an air outflow orifice and thermally insulated from the heat-generating body and the heat-receiving section by a thermally insulating member;

a heat-dissipating section provided inside the thermally insulated space;

heat transfer means for transferring the heat recovered by the heat-receiving section to the heat-dissipating section; and a fan for generating forcibly an air flow inside the thermally insulated space;

wherein the heat generated by the heat-generating body is transferred to the heat-dissipating section via the heat-receiving section and the heat transfer means and dissipated by using the fan inside the thermally insulated space; and wherein the heat transfer means is selected from a group including a metal material made of copper and/or aluminum, a heat pipe, and a coolant channel with a coolant circulating inside thereof.

7. A cooling structure for electronic equipment for cooling at least one heat-generating body disposed inside a case by recovering heat generated by the heat-generating body and dissipating the heat out of the case, the cooling structure comprising:

a heat-receiving section for recovering heat generated at the heat-generating body;

a thermally insulated space provided with an air inflow orifice and an air outflow orifice and thermally insulated from the heat-generating body and the heat-receiving section by a thermally insulating member;

a heat-dissipating section provided inside the thermally insulated space;

heat transfer means for transferring the heat recovered by the heat-receiving section to the heat-dissipating section; and a fan for generating forcibly an air flow inside the thermally insulated space;

wherein the heat generated by the heat-generating body is transferred to the heat-dissipating section via the heat-receiving section and the heat transfer means and dissipated by using the fan inside the thermally insulated space; and wherein the thermally insulating member has a two-layer structure comprising an inner layer of an IR-reflecting material and an outer layer of a thermally insulating material.

8. A cooling structure for electronic equipment for cooling at least one heat-generating body disposed inside a case by recovering heat generated by the heat-generating body and dissipating the heat out of the case, the cooling structure comprising:

a heat-receiving section for recovering heat generated at the heat-generating body;

a thermally insulated space provided with an air inflow orifice and an air outflow orifice and thermally insulated from the heat-generating body and the heat-receiving section by a thermally insulating member;

a heat-dissipating section provided inside the thermally insulated space;

heat transfer means for transferring the heat recovered by the heat-receiving section to the heat-dissipating section; and a fan for generating forcibly an air flow inside the thermally insulated space;

wherein the heat generated by the heat-generating body is transferred to the heat-dissipating section via the heat-receiving section and the heat transfer means and dissipated by using the fan inside the thermally insulated space; and wherein the heat-generating body is provided in a plurality, the heat transfer means including a plurality of parallel heat transfer channels connected to the plurality of heat-generating bodies.

9. A cooling structure for electronic equipment for cooling at least one heat-generating body disposed inside a case by recovering heat generated by the heat-generating body and dissipating the heat out of the case, the cooling structure comprising:

a heat-receiving section for recovering heat generated at the heat-generating body;

a thermally insulated space provided with an air inflow orifice and an air outflow orifice and thermally insulated from the heat-generating body and the heat-receiving section by a thermally insulating member;

a heat-dissipating section provided inside the thermally insulated space;

heat transfer means for transferring the heat recovered by the heat-receiving section to the heat-dissipating section; and a fan for generating forcibly an air flow inside the thermally insulated space;

wherein the heat generated by the heat-generating body is transferred to the heat-dissipating section via the heat-receiving section and the heat transfer means and dissipated by using the fan inside the thermally insulated space; and wherein the heat-generating body is provided in a plurality, and the heat transfer means including at least one heat transfer channel in which the heat-generating bodies are arranged in series so that a heat-generating body with a relatively small quantity of heat generation is positioned upstream in the heat transfer direction and a heat-generating body with a relatively large quantity of heat generation is positioned downstream in the heat transfer direction.

10. A cooling structure for electronic equipment for cooling at least one heat-generating body disposed inside a case by recovering heat generated by the heat-generating body and dissipating the heat out of the case, the cooling structure comprising:

a thermally insulated space provided with an air inflow orifice and an air outflow orifice and thermally insulated from the heat-generating body by a thermally insulating member;

a heat-dissipating section provided inside the thermally insulated space; and heat transfer means for transferring the heat generated from the heat generating body to the heat-dissipating section;

wherein the heat generated by the heat-generating body is transferred to the heat-dissipating section and dissipated inside the thermally insulated space; and wherein the thermally insulated space is provided inside a separate case connected to an outside of the case via the heat transfer means.

* * * * *